(12) United States Patent
Nei et al.

(10) Patent No.: US 6,492,649 B1
(45) Date of Patent: Dec. 10, 2002

(54) PROJECTION EXPOSURE APPARATUS, PROJECTION EXPOSURE METHOD, OPTICAL CLEANING METHOD AND METHOD OF FABRICATING SEMICONDUCTOR DEVICE

(75) Inventors: Masahiro Nei, Yokohama (JP); Taro Ogata, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/490,781

(22) Filed: Jan. 24, 2000

Related U.S. Application Data

(63) Continuation of application No. PCT/JP98/03319, filed on Jul. 24, 1998.

(30) Foreign Application Priority Data

| Jul. 25, 1997 | (JP) | 9-199710 |
| Dec. 8, 1997 | (JP) | 9-337104 |
| Mar. 17, 1998 | (JP) | 10-067021 |

(51) Int. Cl.[7] ............................................. G02B 27/42
(52) U.S. Cl. ..................... 250/548; 355/53; 356/400
(58) Field of Search ............................. 250/548; 355/53, 355/55; 356/399–401

(56) References Cited

U.S. PATENT DOCUMENTS 5,677,757 A * 10/1997 Taniguchi et al. ............ 355/53
5,892,573 A    4/1999 Takahashi et al.
5,898,477 A    4/1999 Yoshimura et al.

FOREIGN PATENT DOCUMENTS

| EP | 0 874 283 A2 | 10/1998 |
| JP | A-5-343288 | 12/1993 |
| JP | A-6-77107 | 3/1994 |
| JP | A-6-204113 | 7/1994 |
| JP | A-9-63948 | 3/1997 |
| JP | A-10-116766 | 5/1998 |
| WO | WO98/48451 | 10/1998 |
| WO | WO98/48452 | 10/1998 |
| WO | WO98/57213 | 12/1998 |

* cited by examiner

*Primary Examiner*—Stephone Allen
(74) *Attorney, Agent, or Firm*—Oliff & Berridge, PLC

(57) ABSTRACT

Transmittances of the optical system are calculated and a predicitive line of time-varying transmittance is calculated. When the exposure is started, the transmittance of the optical system is calculated at the elapsed time of exposure based on the predictive line of time-varying transmittance, and the intensity of exposure light is controlled The illuminance on the wafer can be compensated for depending on the actual variation of the transmittance. The accumulated quantity of exposure light incident to the wafer is regulated to ensure a target exposure dose of the wafer regardless of the variation in the transmittance of an illumination optical system or a projection optical system during exposure.

61 Claims, 17 Drawing Sheets

PROJECTION EXPOSURE APPARATUS, PROJECTION EXPOSURE METHOD, OPTICAL CLEANING METHOD AND METHOD OF FABRICATING SEMICONDUCTOR DEVICE

This application is a continuation application of PCT Application No. PCT/JP98/03319 filed Jul. 24, 1998.

The disclosures of the following priority applications are herein incorporated by reference:

Japanese Patent Application No. 9-199710
Japanese Patent Application No. 9-337104
Japanese Patent Application No. 10-67021

TECHNICAL FIELD

The present invention relates to a projection exposure apparatus employed to expose a pattern of an original such as a mask or a reticule (hereafter referred to as a mask) onto a photosensitive substrate such as a wafer during a photolithography process implemented during the fabrication of a semiconductor device such as an LSI, an image-capturing element such as a CCD, a liquid crystal display element, or a semiconductor device such as a thin film magnetic head, a projection exposure method utilizing this exposure aparatus, an optical cleaning method employed to clean the optical systems in the projection exposure apparatus and a method of fabricating a semiconductor device.

BACKGROUND ART

Keeping pace with the increasingly higher integration achieved for semiconductor devices, significant progress has been made in the area of projection exposure apparatuses employed during the photolithography process that is crucial in fabrication of semiconductor devices. The resolving power achieved by a projection optical system mounted at a projection exposure apparatus is expressed through the relational expression $R = k \times \lambda / NA$, known widely as Rayleigh's formula. In this relational expression, R represents the resolving power of the projection optical system, $\lambda$ represents the wavelength of the exposing light, NA represents the numerical aperture at the projection optical system and k represents a constant which is determined by process-related factors as well as the resolving power of the resist.

The resolving power required of the projection optical system to support higher integration in the semiconductor device may be achieved by reducing the wavelength of the light from the exposing light source or by increasing the numerical aperture at the projection optical system as the relational expression above indicates. Thus, continuous efforts to achieve a higher NA value have been made. In recent years, exposure aparatuses that use a krypton fluoride excimer laser (KrF excimer laser) having an output wavelength of 248 nm as an exposing light source with the numerical aperture at 0.6 or higher achieved at the projection optical system have been put into practical use to enable exposure of extremely fine patterns of down to 0.25 $\mu$m.

An argon fluoride excimer laser (ArF excimer laser) having an output wavelength of 193 nm has been attracting much attention recently as a light source to replace the krypton fluoride excimer laser. Since it is expected that by realizing an exposure apparatus using this argon fluoride excimer laser as the exposing light source, ultra-fine processing down to 0.18 $\mu$m~0.13 $\mu$m will be possible, concentrated efforts are being made in research and development.

Since there are at present only two materials, i.e., synthetic silica glass and calcium fluoride (fluorite), that may be used to constitute the lenses while achieving a satisfactory transmittance in the wavelength range of the output wavelength (193 nm) of the argon fluoride excimer laser, tireless efforts are being made to develop an optical material achieving sufficient transmittance and sufficient internal consistency to be used in this type of exposure apparatus. Currently, synthetic silica glass achieves an internal transmittance of 0.995/cm or higher, and calcium fluoride has reached a point at which the level of internal absorption can be disregarded.

The choice of material to constitute the anti-reflection film that is coated on the surface of the optical material, too, is extremely limited compared to the range of materials from which selection can be made to constitute an anti-reflection film used in the output wavelength range (248 nm) of the krypton fluoride excimer laser, and this also greatly restricts the degree of freedom afforded in design. However, thanks to the intense efforts made in development this problem, too, is being overcome. At present, the levels of losses at the individual lens surfaces (e.g., losses through the absorption of light by the coating, scattering of light, reflection at the interface of the coating and the optical material and reflection at the coating surface) have been lowered to 0.005 or less (light loss of 0.5% or less).

DISCLOSURE OF INVENTION

In wavelength ranges shorter than the wavelength of KrF excimer laser light, moisture and organic substances may adhere to the surfaces of the optical elements constituting the optical systems (illumination optical system, projection optical system) in the projection exposure apparatus, resulting in a reduction in transmittance of the optical systems. This problem is attributable to gas trapped within the space enclosed by a plurality of optical elements or moisture and organic substances generated from the inner walls of the lens barrel or the like supporting the optical systems becoming adhered to the surfaces of the optical systems.

FIG. 17 illustrates time-varying transmittance characteristics in an optical system. The figure presents the optical system transmittance, which represents the ratio of the illuminance of the exposing light between the laser light source and the mask and the illuminance of the exposing light on the wafer measured over specific intervals while irradiating pulse laser light continuously from the laser light source during the laser irradiation and is calculated for each measuring time point. The figure also presents a similar optical system transmittance during a time period in which the laser is stopped that is obtained by irradiating laser over appropriate time intervals and calculated at each laser irradiation. As FIG. 17 illustrates, after the start of laser light irradiation, the transmittance gradually increases and when a specific length of time has elapsed, a near-saturated state is achieved. This phenomenon of the optical system transmittance gradually recovering is due to moisture and organic substances adhering to the optical system surface being removed from the optical system surfaces by the laser irradiation. For this reason, it is conceivable to start an exposure operation after a near-saturated state of transmittance is achieved by irradiating exposing laser light over a specific period of time prior to the start of the exposure. However, this would cause a reduction in throughput. In addition, oscillation of the laser over a long period of time prior to the exposure would lead to poor durability of the laser light source and it is, therefore, not desirable. Furthermore, it is difficult to continuously irradiate exposing laser light at all times, including during replacement of the wafer or the mask.

A first object of the present invention is to provide a projection exposure method and a projection exposure apparatus that make it possible to sustain the illuminance of the exposing light on a photosensitive substrate at a target value at all times regardless of time-varying transmittance of the optical system.

A second object of the present invention is to provide a projection exposure method and a projection exposure apparatus that controls the accumulated light quantity (exposure dose) of the exposing light on a photosensitive substrate at a correct value that corresponds to the sensitivity of the photosensitive substrate even when the transmittances at the illumination optical system and the projection optical system change.

A third object of the present invention is to provide an optical cleaning method for cleaning the optical systems by predicting time-varying transmittance at the illumination optical system and the projection optical system.

A fourth object of the present invention is to provide a method of fabricating a semiconductor device that achieves an improvement in the yield by exposing a circuit pattern or the like on a semiconductor substrate by predicting time-varying transmittance at the illumination optical system and the projection optical system.

A fifth object of the present invention is to provide a projection exposure method and a projection exposure apparatus that makes it possible to achieve a correct exposure dose at a photosensitive substrate in correspondence to changes in the transmittance occurring at the illumination optical system and the projection optical system even when conditions under which the photosensitive substrate is exposed, conditions under which the mask is illuminated and the like are changed.

A sixth object of the present invention is to provide a projection exposure method and a projection exposure apparatus that prevent any fluctuation in the exposure dose occurring on a photosensitive substrate due to changes in the transmittance occurring at the illumination optical system and the projection optical system even when a change occurs in at least one of the following; the intensity distribution of the exposing light on the pupil surface of the projection optical system, i.e., the intensity distribution of a secondary light source within the illumination optical system (namely, the shape and size), the pattern on the mask to be transferred onto the photosensitive substrate and the numerical aperture at the projection optical system.

The present invention is applied in a projection exposure apparatus having an optical system that projects an image of a pattern illuminated by exposing light emitted by an exposing light source onto a photosensitive substrate with time-varying transmittance of the exposing light at the optical system and a projection exposure method employed in combination with the projection exposure apparatus. The objects described above are achieved by measuring the transmittance of the optical system with regard to light having a wavelength substantially equal to the wavelength of the exposing light at a plurality of time points, predicting of time-varying transmittance characteristics of the optical system based upon the plurality of transmittances thus measured and projecting the pattern onto the photosensitive substrate based upon the results of the prediction.

It is desirable to measure the transmittance using exposing light emitted from the exposing light source. The plurality of time points at which the transmittance is measured may be a time point before the pattern is projected onto the photosensitive substrate, i.e., a time point before the light having the wavelength which is substantially the same as that of the exposing light is irradiated on the optical system and a time point after the light having the wavelength which is substantially the same as that of the exposing light is irradiated on the optical system over a specific length of time. Alternatively, the plurality of time points at which the transmittance is measured may constitute a time point before the image of the pattern illuminated by the exposing light is projected onto the photosensitive substrate and a time point after the image of the pattern illuminated by the exposing light is projected onto the photosensitive substrate.

The plurality of time points at which the measurement is performed may constitute, for instance, a time point before the image of the pattern illuminated by the exposing light is projected onto a single photosensitive substrate and a time point after the image of the pattern illuminated by the exposing light is projected onto the single photosensitive substrate. Alternatively, the plurality of time points for performing the measurement may constitute a time point before the image of a pattern illuminated by the exposing light is projected onto a specific area on a photosensitive substrate and a time point after the image of the pattern illuminated by the exposing light is projected onto the specific area. In this case, the plurality of time points may be time points before and after exposure processing performed on the exposure area of a single chip or time points before and after exposure processing performed on an exposure area corresponding to one shot.

If the optical system includes an illumination optical system that illuminates a pattern with exposing light and a projection optical system that projects the image of a pattern illuminated by the illumination optical system onto a photosensitive substrate, it is desirable to predict time-varying transmittance only at the optical system at which the transmittance fluctuates.

According to the present invention, the intensity of the exposing light irradiated onto the photosensitive substrate can be adjusted based upon predicted time-varying transmittance characteristics. Alternatively, the accumulated light quantity of the exposing light irradiated onto the photosensitive substrate can be controlled at a correct value that corresponds to the sensitivity of the photosensitive substrate based upon calculated time-varying transmittance characteristics.

In the method for controlling the accumulated light quantity in which the photosensitive substrate is made to move relative to the exposing light from the mask to pass through the projection optical system in synchronization with the movement of the mask relative to the exposing light during the process of emitting a pulse beam of exposure light from an exposing light source and projecting a pattern formed on the mask onto the photosensitive substrate, the accumulated light quantity of the exposing light can be controlled at a correct value corresponding to the sensitivity of the photosensitive substrate by adjusting at least one of the intensity of the exposing light entering the photosensitive substrate, the width of the exposing light on the photosensitive substrate relative to the traveling direction in which the photosensitive substrate moves, the traveling speed of the photosensitive substrate moving relative to the traveling direction and the oscillation frequency of the exposing light source, based upon the time-varying transmittance characteristics.

In addition, the present invention is adopted in a method of fabricating a semiconductor device by using a projection exposure apparatus having an optical system that projects the image of a pattern illuminated by exposing light emitted from an exposing light source onto a photosensitive substrate with the time-varying transmittance of the exposing light at the optical system. The objects described above are achieved by measuring the transmittance of light having a wavelength that is substantially equal to the wavelength of the exposing light at the optical system at a plurality of time points, predicting of time-varying transmittance characteristics at the optical system based upon a plurality of measured transmittances and projecting the image of the pattern onto the photosensitive substrate based upon the results of the prediction.

Furthermore, the present invention is adopted in an optical cleaning method implemented to clean an optical system that projects the image of a pattern illuminated by exposing light from an exposing light source onto a photosensitive substrate provided in a projection exposure apparatus with the transmittance of the exposing light at the optical system changing over time. The objects described earlier are achieved by measuring the transmittance of light having a wavelength substantially equal to the wavelength of the exposing light at the optical system at a plurality of time points and optically cleaning the optical system while predicting the time-varying transmittance characteristics at the optical system based upon a plurality of measured transmittances.

The projection exposure apparatus according to the present invention may comprise a mask illuminance detector that detects an illuminance of an exposing light irradiated on a mask from an exposing light source, a substrate illuminance detector that detects the illuminance of the exposing light on a photosensitive substrate, a means for prediction that predicts time-varying transmittance characteristics of the exposing light at the projection optical system by calculating the ratio of the illuminance of the exposing light irradiated on the mask detected by the mask illuminance detector and the illuminance of the exposing light irradiated on the substrate detected by the substrate illuminance detector a plurality of times and a control device that adjusts the accumulated light quantity of the exposing light entering the photosensitive substrate based upon the predicted time-varying characteristics and the ratio of the two illuminances.

If the exposing light source is constituted of a pulsed light source, the control device may adjust at least, either the intensity of pulsed exposing light irradiated onto the photosensitive substrate or the number of pulses to ensure that the accumulated light quantity of the exposing light irradiated onto the photosensitive substrate achieves a correct value that corresponds to the type of the photosensitive substrate based upon the predicted time-varying characteristics and the ratio of the two illuminances.

The projection exposure method according to the present invention comprises a step in which time-varying transmittance characteristics of the exposing light at, at least, either an illumination optical system or a projection optical system are predicted by calculating the ratio of the illuminance of the exposing light emitted by an exposing light source and the illuminance of the exposing light on a photosensitive substrate a plurality of times and a step in which, at least, either the intensity of the pulsed exposing light entering the photosensitive substrate or the number of pulses is adjusted based upon the ratio of the iilluminance of the exposing light emitted by the exposing light source and the illuminance of the exposing light on the photosensitive substrate and the predicted time-varying transmittance characteristics.

The present invention is adopted in an exposure method implemented in a projection exposure apparatus having an illumination optical system that illuminates a mask on which a specific pattern is formed with exposing light emitted by an exposing light source and a projection optical system that projects the image of the pattern on the mask illuminated by the illumination optical system onto a photosensitive substrate, with the transmittance of the exposing light at, at least, either the illumination optical system or the projection optical system changing over time. The objects described earlier are achieved by adjusting the intensity of the exposing light irradiated onto the photosensitive substrate based upon the ratio of the illuminance of the exposing light emitted by the exposing light source and the illuminance of the exposing light on the photosensitive substrate and the time-varying characteristics of the exposing light transmittance at, at least, either the illumination optical system or the projection optical system. Or, if the exposing light source is constituted of a pulsed light source, the objects described earlier are achieved by adjusting at least, either the intensity of the exposing light entering the photosensitive substrate or the number of pulses.

In a projection exposure apparatus in which the exposing light transmittance changes over time at its projection optical system alone among the illumination optical system and the projection optical system, the objects described above can be achieved by adjusting the accumulated light quantity of the exposing light entering the photosensitive substrate based upon the ratio of the illuminance of the exposing light emitted from the exposing light source and the illuminance of the exposing light on the photosensitive substrate and also based upon the time-varying characteristics of the exposing light transmittance at the projection optical system.

If the exposing light transmittance at the illumination optical system, too, changes over time, the objects described earlier can be achieved by adjusting the intensity of the exposing light emitted from the exposing light source based upon the time-varying characteristics of the exposing light transmittance in the entire optical system comprising the illumination optical system and the projection optical system and the ratio of the illuminances noted-above.

If the exposing light is a pulse beam, the accumulated light quantity of the exposing light can be controlled at a correct value that corresponds to the sensitivity of the photosensitive substrate by adjusting, at least, either the intensity of the exposing light entering the photosensitive substrate or the number of pulse beams of the exposing light irradiated on a given spot on the photosensitive substrate.

The exposure method described above may be adopted on an exposure apparatus that transfers a pattern onto a photosensitive substrate by causing the substrate to travel relative to the exposing light from the mask passing through the projection optical system in synchronization with the movement of the mask relative to the exposing light. In such a scan-type exposure apparatus, the exposing light may be a pulse beam. When the exposing light is a pulse beam, the accumulated light quantity of the exposing light is controlled at a correct value that corresponds to the sensitivity of the photosensitive substrate by adjusting at least one of: the intensity of the exposing light entering the photosensitive substrate, the width of the exposing light on the photosensitive substrate relative to the traveling direction in which the photosensitive substrate moves, the traveling speed at which the photosensitive substrate moves in the traveling direction and the oscillation frequency of the exposing light source.

The present invention is adopted in a projection exposure apparatus having an illumination optical system that illuminates a mask at which a specific pattern is formed with exposing light emitted by an exposing light source and a projection optical system that projects the image of the pattern at the mask illuminated by the illumination optical system onto a photosensitive substrate with the exposure light transmittance at the projection optical system changing over time. The objects described earlier are achieved by providing a mask illuminance detector that detects the illuminance of the exposing light irradiated on the mask from the exposing light source, a substrate illuminance detector that detects the illuminance of the exposing light on the photosensitive substrate, a storage device that stores in memory time-varying characteristics of the exposing light transmittance at the projection optical system and a control device that adjusts the accumulated intensity of the exposing light entering the photosensitive substrate based upon the ratio of the illuminance of the exposing light irradiated on the mask detected by the mask illuminance detector and the illuminance of the exposing light irradiated onto the photosensitive substrate detected by the substrate illuminance detector and the time-varying characteristics stored in the storage device. In addition, the control device may adjust at least, either the intensity or the number of the exposing light irradiated onto the photosensitive substrate to ensure that the accumulated light quantity of the exposing light irradiated onto the photosensitive substrate achieves a correct value that corresponds to the photosensitive substrate.

If the exposing light transmittance at the illumination optical system also changes over time in this projection exposure apparatus, it is desirable to store in memory the time-varying characteristics of the exposing light transmittance in the entire optical system comprising the illumination optical system and the projection system in the storage device. The storage device is capable of storing a plurality of sets of time-varying transmittance characteristics of the exposing light in correspondence to various exposure conditions. If a given set of exposure conditions does not match the exposure conditions stored in memory in the storage device, the transmittance is calculated through an interpolation operation performed on the time-varying characteristics stored in memory. The exposure conditions in this context refer to the illumination conditions of the illumination optical system (e.g., the diameter of the variable aperture stop at the illumination system, a modified illumination or a normal illumination etc.), the type of the mask and the numerical aperture at the projection optical system.

It is to be noted that if the exposing light is continuous light, either the intensity of the exposing light on the photosensitive substrate or the length of the irradiation period may be adjusted, or both may be adjusted. If the exposing light is pulsed light, either the pulse intensity of the exposing light on the photosensitive substrate or the number of pulses may be adjusted, or both may be adjusted. When exposure is achieved by scanning exposing light onto an exposure area on the photosensitive substrate that corresponds to the pattern area of the mask, at least one of: the intensity of the exposing light, the width of the exposing light along the scanning direction, the scanning speed of the substrate along the scanning direction and the oscillation frequency of the light source may be adjusted.

As explained above, according to the present invention, exposure performed on a photosensitive substrate is controlled based upon predicted time-varying transmittance characteristics of the exposing light calculated for, or based upon time-varying transmittance characteristics of the exposing light corresponding to various exposure conditions that are stored in advance. Thus, even when the transmittance at the illumination optical system or the projection optical system fluctuates during an exposure operation or while the apparatus is in a stopped state, the photosensitive substrate can be exposed correctly. For instance, the illuminance on the photosensitive substrate can be controlled at a correct value, or the accumulated light quantity (exposure dose) of the exposing light on the photosensitive substrate can be controlled at a correct value that corresponds to the sensitivity of the photosensitive substrate at all times.

In addition, according to the present invention, even when conditions under which the photosensitive substrate is exposed, conditions under which the mask is illuminated and the like are changed, or even when, at least one of: the intensity distribution of the exposing light on the pupil surface at the projection optical system, i.e., the intensity distribution of a secondary light source within the illumination optical system (the shape and size), the pattern on the mask to be transferred on the photosensitive substrate and the numerical aperture at the projection optical system, is changed, fluctuations in the exposure dose on the photosensitive substrate due to changes occurring in the transmittances at the illumination optical system and the projection optical system can be prevented from occurring by calculating the predicted time-varying transmittance characteristics that correspond to the specific changes or by storing in memory in advance time-varying transmittance characteristics that correspond the specific changes.

Furthermore, the predicted time-varying transmittance characteristics may be calculated by irradiating light having a wavelength substantially equal to the wavelength of the exposing light prior to the actual exposure operation so that the predicted time-varying transmittance characteristics can be calculated concurrently during optical cleaning performed prior to the exposure processing to prevent any reduction in throughput.

Moreover, according to the present invention, in which a semiconductor device is fabricated by calculating predicted time-varying transmittance characteristics and controlling the exposure operation based upon the predicted characteristics, an improvement is achieved in the production yield of semiconductor devices.

BEST MODE FOR CARRYING OUT THE INVENTION (First embodiment in which exposure processing is performed by predicting time-varying transmittance characteristics)

Figure 1:
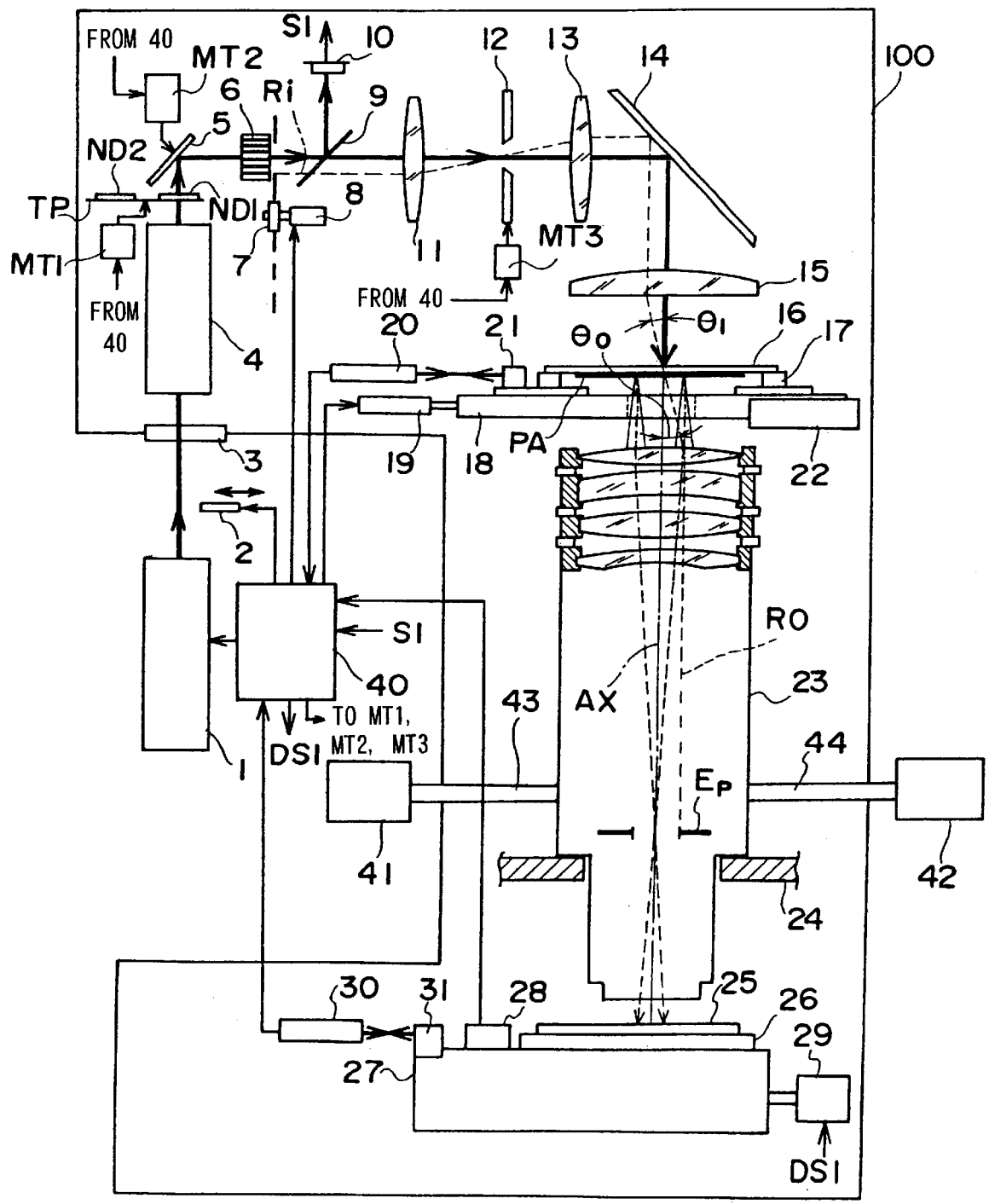
FIG. 1 illustrates a schematic structure of the projection exposure apparatus according to the present invention.

The following is an explanation of the first embodiment of the present invention given in reference to the drawings. FIG. 1 illustrates a schematic structure of the projection exposure apparatus according to the present invention. As shown in FIG. 1, laser light constituted of almost parallel light flux is emitted by an ArF excimer laser light source 1 that oscillates a pulsed light having an output wavelength of, for instance, 193 nm, and the laser light is guided to a light transmitting window 3 at a main unit of the projection exposure apparatus via a shutter 2. The shutter 2 closes the illumination light path during a replacement of the wafer or the reticule, for instance, thereby causing self-oscillation at the light source 1 to stabilize (adjust) beam characteristics that include at least one of: the central wavelength, the wavelength width and the intensity of the pulsed light.

The main unit of the projection exposure apparatus is housed inside a chamber 100 and is controlled to maintain a constant temperature. The laser light having passed through the light transmitting window 3 is shaped into laser light achieving a specific cross sectional outline at a beam shaping optical system 4, passes through one of a plurality of ND filters (ND1 in FIG. 1) having different transmittances (extinction rates) from each other that are provided at a turret plate TP to be reflected by a reflecting mirror 5 and then is guided to a fly-eye lens 6 constituting an optical integrator. The fly-eye lens 6 is constituted by bundling together a number of lens elements, with numerous of light source images (secondary light sources) the number of which corresponds to the number of lens elements constituting the fly-eye lens 6 formed at the emission surfaces of the lens elements.

In this embodiment, the turret plate TP holds six ND filters ND1~ND6 (only ND1 and ND2 shown in the figure), and by causing the turret plate TP to rotate with a motor MT1, the six ND filters may be positioned within an illumination optical system in an interchangeable manner. One of the six ND filters is selected depending upon the sensitivity of the resist on the wafer 25, the inconsistency in the oscillation intensity of the light source 1, the accuracy of control of the exposure dose implemented on the wafer 25 and the like. In addition, an appropriate ND filter is selected in correspondence to the number of pulse beams (the number of exposure pulses) to be irradiated on a given point on the wafer 25 during the process of scanning exposure. The number of exposure pulses in this context refers to the number of pulse beams that are irradiated at a given point on the wafer 25 while the point crosses an area that is conjugate with an illumination area on a reticule 16 defined by a variable-field stop 12 relative to a projection optical system 23 (i.e., an area on which an image of a portion of the pattern at the reticule 16 present inside the illumination area is projected) along its scanning direction.

Instead of the turret plate TP in FIG. 1, two plates each having a plurality of slits may be provided facing opposite each other to adjust the intensity of the pulsed light by moving the two plates relative to each other along the direction in which the slits are formed.

The light source 1 oscillates pulsed light in response to a trigger pulse transmitted by a light source control circuit 45 (see FIG. 6), and the light source control circuit 45 adjusts the voltage applied to the light source 1 (charging voltage) to adjust the intensity of the pulsed light emitted from the light source 1. It is to be noted that the light source control circuit 45 controls the light source 1 in response to commands from a main controller (control circuit) 40 that implements overall control of the entire projection exposure apparatus.

In the embodiment, the intensity of the pulsed light on the reticule 16, i.e., on the wafer 25, can be adjusted through, at least, either through adjustment of the oscillation intensity at the light source 1 implemented by the light source control circuit 45 or through adjustment of the transmittance (extinction rate) of the pulsed light implemented at the turret plate TP.

In the embodiment, the mirror 5 is caused to rotate (oscillate) by a motor MT2 while the wafer 5 is being exposed using the image of the pattern at the reticule 16 by causing the reticule 16 and the wafer 25 to move in synchronization with each other, as disclosed in Japanese Laid-Open Patent Publication No. H7-142354, for instance. Thus, interference fringes such as speckles move within the illumination area on the reticule 16 defined by the variable-field stop 12 during scanning exposure, to achieve near consistency in the distribution of the accumulated light quantity of the pulsed light on the wafer 25. At this time, the interference fringes are moved at least once while one point on the reticule 16 crosses the illumination area along the scanning direction. In addition, it is desirable to oscillate the reflecting mirror 5 so that the interference fringes move along the scanning direction and also relative to the direction perpendicular to the scanning direction of the reticule 16 within the illumination area. When moving the interference fringes along the scanning direction within the illumination area, the angle over which the reflecting mirror 5 is swung between pulsed light emissions, i.e., the distance over which the interference fringes are moved, should be determined by taking into consideration the distance over which the reticule 16 moves between the pulsed light emissions so that the positional relationship between the one point on the reticule 16 and the interference fringes changes while the one point crosses the illumination area.

While one fly-eye lens 6 is provided in this embodiment, a fly-eye lens constituting a second optical integrator may be provided between the reflecting mirror 5 and the turret plate TP as disclosed in, for instance, Japanese Laid-Open Patent Publication No. H1-259533. Alternatively, a rod-shaped optical member that achieves internal reflection may be employed as an optical integrator in place of the fly-eye lens.

As detailed later, at the positions at which the numerous secondary light sources are formed by the fly-eye lens 6, a turret plate 7 having a plurality of aperture stops 7a~7h with, at least, either different shapes or different sizes from one another is provided. The turret plate 7, which is driven by a motor 8 to rotate, is inserted inside the optical path of the illumination optical system with one aperture stop selected in correspondence to the pattern at the reticule 16 to be transferred onto the wafer 25. The turret plate 7 and the motor 8 constitute an illumination system variable aperture stop device.

The light beams from the numerous secondary light sources formed by the fly-eye lens 6 are then branched into two optical paths by a beam splitter 9 after they pass through the variable aperture stop at the turret plate 7, and the reflected light is guided to an integrator sensor (photoelectric detector) 10 where the illuminance of the illumination light is detected. A signal that corresponds to the detected illuminance is input to the control circuit 40. The transmitted light, on the other hand, travels through a relay lens 11, the variable field stop 12 that defines a rectangular opening and a relay lens 13 to be reflected at a reflecting mirror 14 and then is condensed at a condenser optical system 15 constituted of a refractive optical element such as a plurality of lenses. Thus, almost consistent illumination of the illumination area on the reticule 16 defined by the opening at the variable field stop 12 is achieved in a superimposed manner. Then the image of the circuit pattern on the reticule 16 is formed on the wafer 25 by the projection optical system 23, and the resist applied onto the wafer 25 is exposed, thereby transferring the circuit pattern image onto the wafer 25.

The illumination area on the reticule 16 defined by the variable field stop 12 is set to have a width along the direction in which the reticule 16 is scanned that is smaller than the width of the pattern area and a width along the direction perpendicular to the scanning direction that is larger than the width of the pattern area. In addition, the illumination area extends inside the circular image field at the projection optical system 23 along its diameter around an optical axis AX of the projection optical system 23.

By moving at least one of the blades constituting the variable field aperture 12 with the motor MT3, the shape and size of the rectangular opening at the variable field stop 12 can be varied. In particular by changing the width of the rectangular opening in the direction of the short side, the width of the illumination area along the scanning direction on the reticule 16 is changed, which makes it possible to adjust the accumulated light quantity (exposure dose) of a plurality of pulse beams irradiated on one point on the wafer through scanning exposure, since the number of pulse beams irradiated on the point while it crosses the rectangular area which is conjugate with the illumination area on the reticule 16 relative to the projection optical system 23 along the scanning direction is changed.

As explained above, in the embodiment, the oscillation frequency at the light source 1 can be changed by a trigger pulse transmitted from the light source control circuit 45, and thus, the accumulated light quantity of a plurality of pulse beams irradiated on one point on the wafer 25 during scanning exposure can be adjusted. In addition, by changing the scanning speed at which the wafer 25 (and the reticule 16) is scanned, too, the accumulated light quantity of the plurality of pulse beams irradiated on one point on the wafer 25 during scanning exposure can be adjusted, since the number of pulse beams irradiated on the spot while it crosses the projection area which is conjugate with the illumination area on the reticule 16 along the scanning direction is changed in correspondence to changes in the oscillation frequency or the scanning speed, as explained above.

In a scanning-type projection exposure apparatus, at least, either the intensity of the pulsed light on the wafer 25 or the number of pulse beams irradiated on the individual points on the wafer 25 during scanning exposure is adjusted to control the accumulated light quantity (exposure dose) of the plurality of pulse beams irradiated on each point within an area of the wafer 25 that is exposed by the image of the pattern at the reticule 16 at a correct value that corresponds to the sensitivity of the photoresist on the wafer 25.

As explained above, the oscillation intensity at the light source 1 and the transmittance (extinction rate) of the pulsed light can be changed independently of each other in the embodiment, and by changing at least, either the oscillation intensity or the transmittance, the intensity of the pulsed light on the wafer 25 can be adjusted to achieve optimization of the exposure dose. According to the present invention, optimization of the exposure dose may be achieved by adjusting the number of pulse beams irradiated on each point on the wafer 25 instead of achieving exposure dose optimization through the adjustment of the pulsed light intensity as described above. In other words, in the embodiment, the width of the opening at the variable field stop 12, i.e., the width of the pulsed light on the wafer 45 (corresponds to the projection area explained earlier) along the scanning direction, the oscillation frequency at the light source 1 and the scanning speed at which the wafer 25 is scanned can be changed independently, and by changing at least one of: the pulsed light width, the oscillation frequency and the scanning speed, the number of pulse beams irradiated onto each point on the wafer 25 can be adjusted. It is obvious that optimization of the exposure dose can be achieved by adjusting both the intensity of the pulsed light on the wafer 25 and the number of pulse beams irradiated on each point on the wafer 25.

Namely, in the embodiment, by adjusting at least one of the oscillation intensity at the light source, the transmittance of the pulsed light (extinction rate), the pulsed light width on the wafer 25, the oscillation frequency at the light source 1 and the scanning speed at which the wafer 25 is scanned, the exposure dose at each point on the wafer 25 can be set at a correct value or the accuracy of control of the exposure dose can be set within a required accuracy range (e.g., ±1~2%).

The entire projection optical system 23 in the embodiment is constituted of optical elements such as refracting lenses, and an aperture stop Ep is provided at a position at which the pupil (entrance pupil) of the projection optical system 23 is located. This aperture stop Ep may be constituted of a mechanism that is capable of changing its size so that the numerical aperture at the projection optical system can be varied, and in such a case, the aperture stop Ep in the projection optical system and the variable aperture stops 7a~7h in the illumination optical system are provided at positions that are optically conjugate with each other.

The reticule 16 is securely held at a reticule stage 18 by a reticule holder 17. The reticule stage 18 is provided on a base 22 to make linear movement along a plane perpendicular to the sheet upon which FIG. 1 is presented. A mirror 21 is provided at the reticule holder 17, and laser light from a laser interferometer 20 is reflected by the mirror 21 to enter the laser interferometer 20, which then measures the position of the reticule stage 18. This positional information is input to the control circuit 40 and, based upon the positional information, the control circuit 40 drives a reticule stage drive motor 19 to control the position of the reticule 16 and the speed of the reticule 16 during a scanning exposure operation.

The wafer 25 is securely held at a wafer stage 27 by a wafer holder 26. The wafer stage 27 makes a linear movement along a plane perpendicular to the sheet upon which FIG. 1 is presented. A mirror 31 is provided at the wafer stage 27, and laser light from a laser interferometer 30 is reflected by the mirror 31 to enter the laser interferometer 30, which then measures the position of the wafer stage 27. This positional information is input to the control circuit 40 and, based upon the positional information, the control circuit 40 drives a wafer stage drive motor 29 to control the position of the wafer 25 and the speed of the wafer 25 during a scanning operation. An illuminance sensor (photoelectric detector) 28 is provided on the wafer stage 27 to detect the illuminance of the exposing light irradiated on the wafer 25. The detection signal from the illuminance sensor 28 is input to the control circuit 40.

In the projection exposure apparatus in the embodiment, the illumination optical system is placed in an inert gas atmosphere such as nitrogen gas. For this reason, an inert gas supply device that supplies inert gas to the casing (not shown) of the illumination optical system and an inert gas discharge device that discharges contaminated inert gas from the casing are provided, as disclosed in, for instance, Japanese Laid-Open Patent Publication No. H6-260385. In addition, inert gas such as nitrogen gas is supplied to a plurality of spaces formed between the plurality of optical members constituting the projection optical system 23, and contaminated inert gas is discharged from the plurality of spaces. To achieve this, an inert gas supply device 41 and an inert gas discharge device 42 are provided, with the gas supply device 41 supplying inert gas such as dry nitrogen into the projection optical system 23 via a pipe 43 and the discharge device 42 discharging the gas inside the projection optical system 23 via a pipe 44. It is to be noted that the inert gas use in the projection exposure apparatus does not need to be nitrogen, and selection may be made from gases including helium and argon.

Next, the variable aperture stop device that changes the numerical aperture at the illumination optical system (i.e., the shape and the size of the secondary light source) in the projection exposure apparatus is explained. As illustrated in FIG. 1, when the numerical aperture at the illumination optical system, which is determined by a principal light beam Ri parallel to the optical axis AX from the outermost edge (outermost diameter) of the aperture stop inserted in the optical path of the illumination optical system at the turret plate 7 is represented by NAi (=sin θ i) and the numerical aperture at the projection optical system 23 toward the illumination optical system determined by a principal light beam Ro parallel to the optical axis AX from the outermost edge (outermost diameter) of the aperture stop Ep of the projection optical system 23 is represented by NAo (=sin θ 0), the value of σ as a coherence factor is defined as follows.

$$\sigma = NAi/NAo \quad (1)$$

Since the aperture stop Ep provided at the position at which the pupil (entrance pupil) of the projection optical system 23 is located and the variable aperture stops at the turret plate 7 of the illumination optical system are optically conjugate and the image of the variable aperture stop (image of the secondary light source) is formed at the pupil of the projection optical system 23, the value of θ as the maximum coherence factor can be defined as follows, with D7 representing the diameter of the image of the variable aperture stop and D23 representing the diameter of the aperture stop Ep at the projection optical system 23.

$$\sigma = D7/D23 \quad (2)$$

Normally, the value σ at the projection exposure apparatus is set within a range of 0.3~0.8 during the photolithography process. In the embodiment, the turret plate 7 shown in FIG. 1 is provided with a plurality of aperture stops 7a~7h illustrated in FIG. 2, and one of the aperture stops is selected to suit a specific purpose of use as detailed later.

Figure 2:
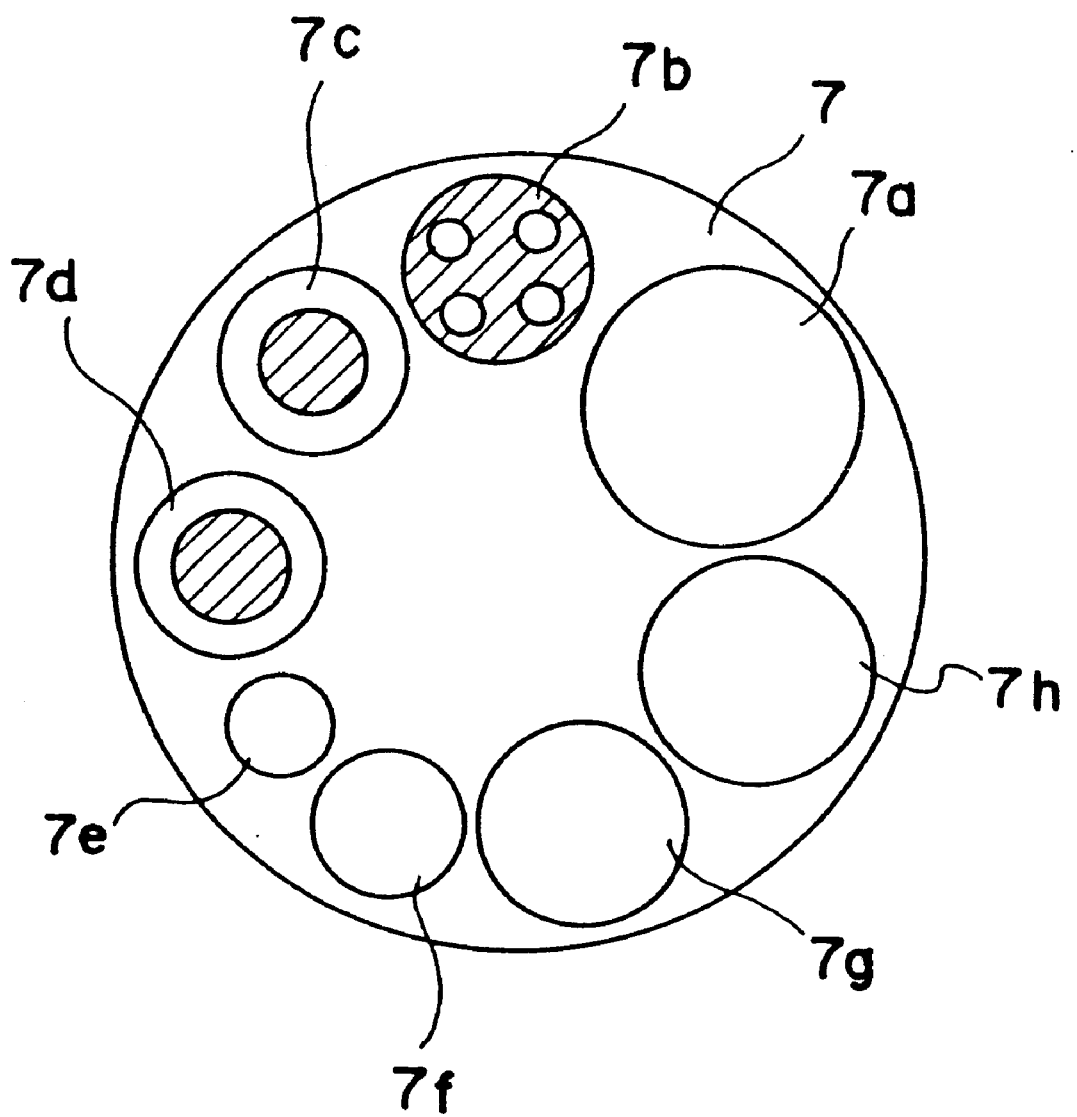
FIG. 2 illustrates the variable aperture stops formed at the turret plate shown in FIG. 1.

As illustrated in FIG. 2, eight aperture stops 7a~7h are formed at the turret plate 7, constituted of a transparent substrate such as quartz. The 5 aperture stops 7a and 7e~7h have round openings and are used to forcibly change the value a with the three aperture stops 7e, 7f and 7g employed during an actual exposure operation and the remaining two aperture stops 7a and 7h employed during an optical cleaning operation. Optical cleaning is a process in which contaminants such as moisture and organic substances adhering to the lens surfaces are removed from the lens surfaces by irradiating laser to improve the transmittance.

The three aperture stops 7b~7d with modified openings are provided to be used during an exposure operation to improve the resolving power (focal depth) of the projection optical system 23. The aperture stops 7c and 7d each has a ring band opening, and the ring band ratio (the ratio of the internal diameter and the external diameter of the ring band opening) of one is different from the ring band ratio of the other. The remaining aperture stop 7b has four decentered openings provided to form four decentered secondary light sources.

The turret plate 7 having the 8 aperture stops 7a~7h is rotated by the motor 8 shown in FIG. 1, so that one aperture stop among the 8 aperture stops, i.e., the stop having the desired aperture opening shape is positioned adjacent to the exit surface of the fly-eye lens 6. In other words, it is set at the focal plane on the exit side where secondary light sources are formed by the fly-eye lens 6. The drive of the motor 8 is controlled by the control circuit 40.

Figure 3:
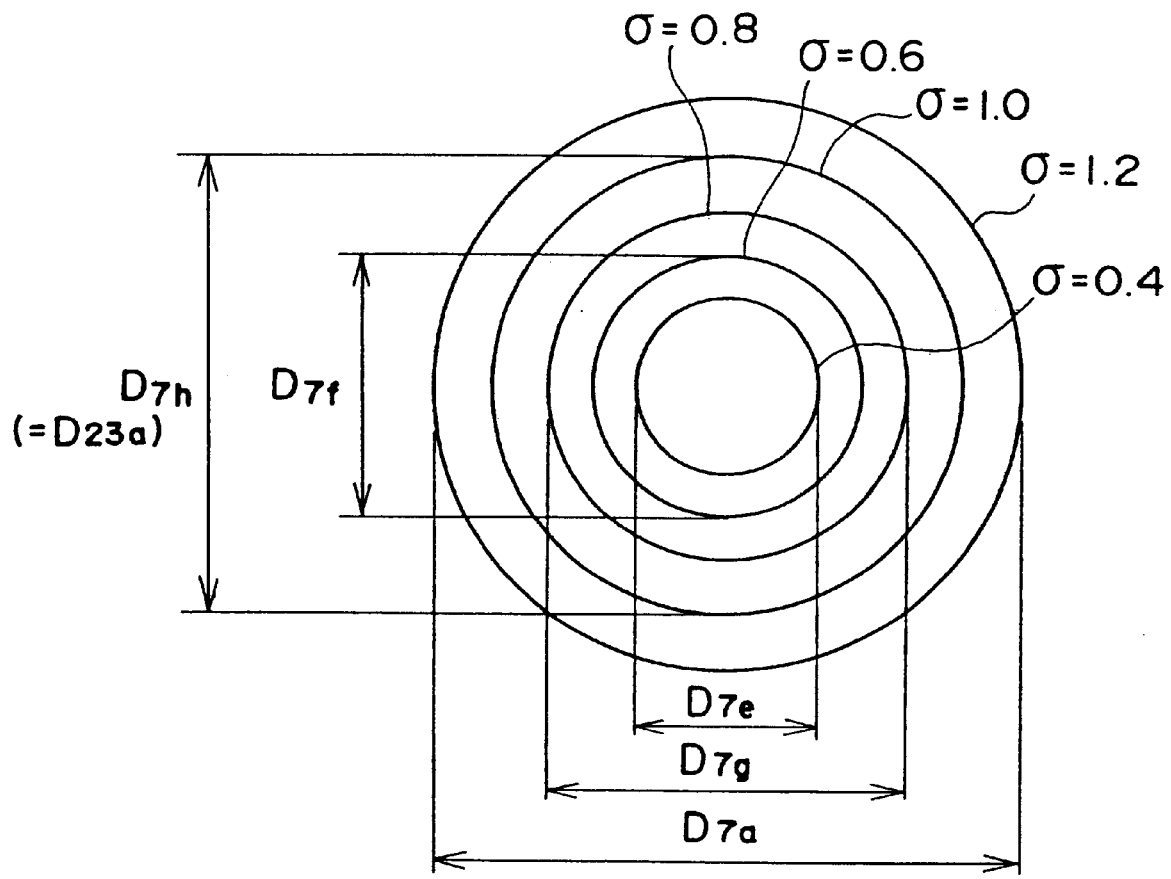
FIG. 3 illustrates the variable aperture stops in the illumination optical system formed at the pupil position of the projection optical system within the projection exposure apparatus illustrated in FIG. 1.

FIG. 3 illustrates the images of the aperture stops 7a and 7e~7h having round openings of different sizes formed on the aperture stop Ep within the projection optical system 23. Each aperture stop is now explained in detail in (1)~(5) below.

(1) When the aperture stop 7e having the smallest round opening is set on the illumination light path, the numerical aperture NAi at the illumination optical system is at the smallest, and at this time, the image of the aperture stop 7e having an opening diameter D7e is formed inside the aperture stop Ep having an opening diameter D23a with the value σ set to 0.4. In other words, a relationship whereby σ=D7e/D23a=NAi/NAo=0.4 is achieved. Consequently, when the aperture stop 7e is set on the illumination light path, the pattern at the reticule 16 can be transferred onto the wafer 25 with the value σ set to 0.4.

(2) When the aperture stop 7f having a round opening larger than that of the aperture stop 7e is set on the illumination light path, the numerical aperture NAi at the illumination optical system becomes larger than that when the aperture stop 7e is set on the illumination light path. At this time, the image of the aperture stop 7f having the opening diameter D7f is formed inside the aperture stop Ep having an opening diameter D23a with the value σ set to 0.6. In other words, a relationship whereby σ=D7f/D23a=NAi/ NAo=0.6 is achieved. Consequently, when the aperture stop 7f is set on the illumination light path, the pattern at the reticule 16 can be transferred onto the wafer 25 with the value σ set to 0.6.

(3) When the aperture stop 7g having a round opening larger than that of the aperture stop 7f is set on the illumination light path, the numerical aperture NAi at the illumination optical system becomes larger than that when the aperture stop 7f is set on the illumination light path. At this time, the image of the aperture stop 7g having the opening diameter D7g is formed inside the aperture stop Ep having an opening diameter D23a with the value σ set to 0.8. In other words, a relationship whereby σ=D7g/D23a=NAi/ NAo=0.8 is achieved. Consequently, when the aperture stop 7g is set on the illumination light path, the pattern at the reticule 16 can be transferred onto the wafer 25 with the value σ set to 0.8.

(4) When the aperture stop 7h having a round opening larger than that of aperture stop 7g is set on the illumination light path, the numerical aperture NAi at the illumination optical system becomes larger than that when the aperture stop 7g is set on the illumination light path. At this time, the image of the aperture stop 7h having the opening diameter D7h that is equal to the opening diameter D23a of the aperture stop Ep is formed with the value σ set to 1.0. In other words, a relationship whereby σ=D7h/ D23a=NAi/ NAo=1.0 is achieved. Consequently, when the aperture stop 7h is set on the illumination light path, the illumination light flux can be guided over the effective diameters of the optical elements constituting the condenser optical system 15 in the illumination optical system, over the effective diameters of the optical elements such as lenses constituting the projection optical system 23 and even over areas well beyond the effective diameters of these optical elements. Thus, moisture, organic substances and the like adhering to the surfaces of these optical elements can be eliminated through the optical cleaning effect achieved by the exposure illumination light flux.

(5) When the aperture stop 7a having a round opening larger than that of the aperture stop 7h is set on the illumination light path, the numerical aperture NAi at the illumination optical system becomes larger than that when the aperture stop 7h is set on the illumination light path. At this time, the image of the aperture stop 7a having the opening diameter D7a is formed to contain the aperture stop Ep having the opening diameter D23a with the value σ set to 1.2. In other words, a relationship whereby σ=D7a/ D23a=NAi/NAo=1.2 is achieved. Consequently, when the aperture stop 7a is set on the illumination light path, the illumination light flux can be guided over to the lens peripheries well beyond the effective diameters of the optical elements as well as over the effective diameters of the optical elements constituting the condenser optical system 15 in the illumination optical system and over the effective diameters of the optical elements such as lenses constituting the projection optical system 23. Thus, the advantage of optically cleaning moisture, organic substances and the like adhering to the surfaces of these optical elements can be fully realized.

The operation achieved in the embodiment is explained. First, as illustrated in FIG. 1, inert gas such as dry nitrogen is supplied from the gas supply device 41 into the projection optical system 23 via the pipe 43, and when the optical projection system is fully charged with inert gas, the gas in the projection optical system 23 is discharged to the outside via the pipe 44 by the discharge device 42. The entire optical path through which the exposing light travels in the illumination optical system, too, is designed to be a sealed structure as in the projection optical system 23, and likewise, inert gas such as dry nitrogen is supplied and charged into the illumination optical system in a similar manner and the gas inside the illumination optical system is discharged by a discharge device.

It is desirable to keep the atmosphere among optical such as lens chambers elements in a dry, cleaned state at all times by operating the gas supply device 41 and the discharge device 42 during exposure. However, the supply device 41 and the discharge device 42 may be stopped after replacing the gas in the spaces formed between the optical elements such as lens chambers prior to the exposure operation. The same principle applies with respect to the illumination optical system.

Next, employing a reticule loading mechanism (not shown), the reticule 16 on which a pattern to be transferred is drawn is delivered and placed onto the reticule stage 18. At this time, the position of the reticule 16 is measured with a reticule alignment system (not shown) and the reticule 16 is set at a specific position with a reticule position control circuit (not shown) based upon the results of the measurement.

Figure 4:
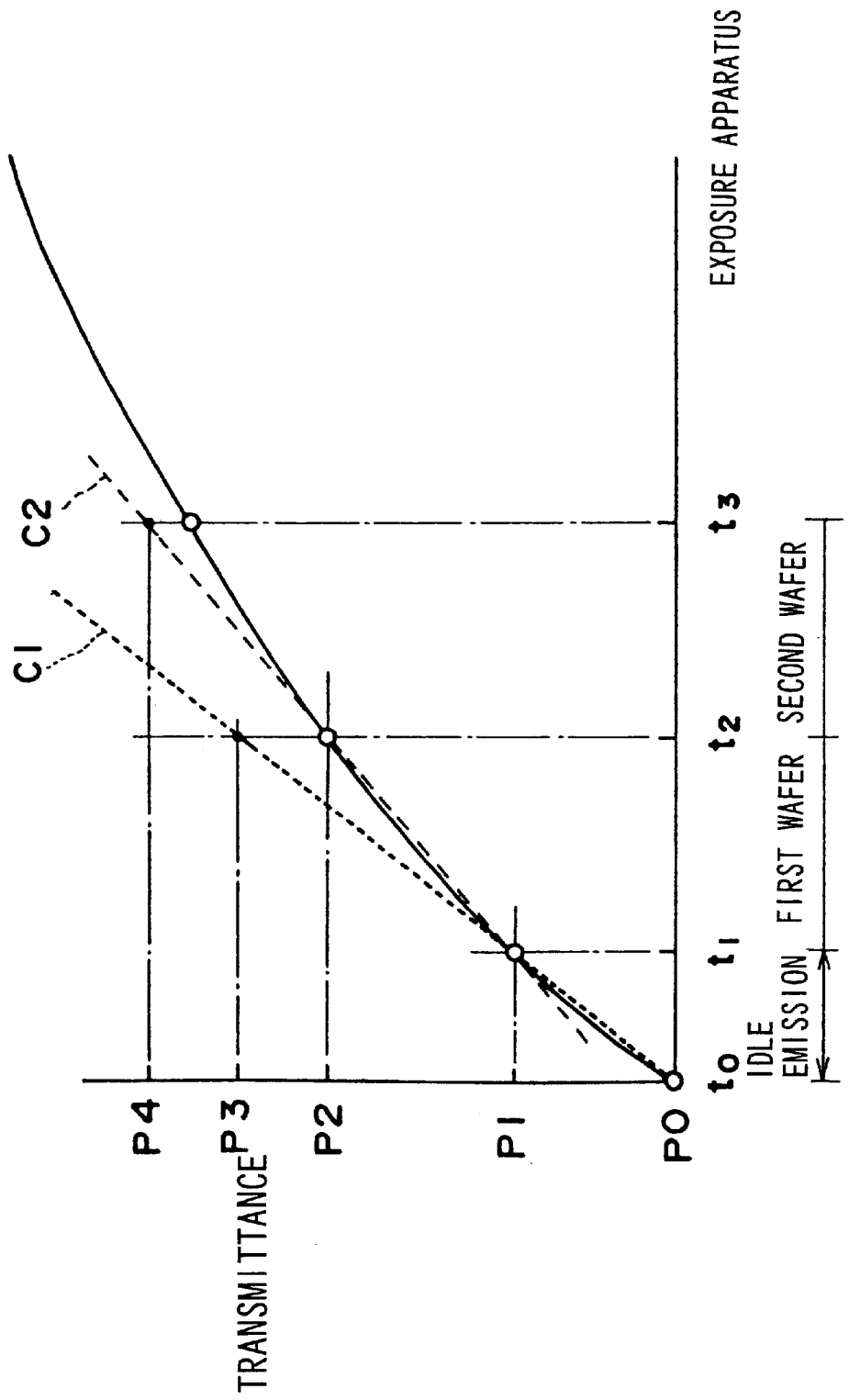
FIG. 4 presents a graph illustrating the relationship between the length of the exposure period and the transmittance.

Before starting the exposure operation, a predictive line of time-varying transmittance at the projection optical system 23 (time-varying transmittance characteristics) as indicated by C1 in FIG. 4 is calculated. FIG. 4 is a graph with the horizontal axis representing the exposure time and the vertical axis representing the transmittance. The transmittance in FIG. 4 is the transmittance at the optical system extending from a half mirror 9 that branches the exposing light into an integrator sensor 10 to the wafer surface (hereafter, this optical system is referred to as the transmittance measurement optical system).

First, by driving the laser light source 1 after the illuminance sensor 28 is positioned on the optical axis of the projection optical system 23, an idle emission of 20,000 pulses, for instance, is performed. The illuminance of the exposing light may be measured at the integrator sensor 10 and the illuminance sensor 28 in synchronization with, for instance, the first pulse. Then the ratio LW/LI of the output LI from the integrator sensor 10 and the output LW from the illuminance sensor 28 is calculated. This ratio represents the transmittance P0 at the exposure start in FIG. 4. Next, the illuminance of the exposing light may be measured at the integrator sensor 10 and the illuminance sensor 28 in synchronization with, for instance, the 20,001st pulse. Then the ratio LW/LI of the output LI from the integrator sensor 10 and the output LW from the illuminance sensor 28 is calculated. The ratio represents the transmittance P1 at the exposure time point t1 in FIG. 4.

Through the self-cleaning effect achieved through the idle emission of laser pulses, moisture and organic substances adhered on the surfaces of the transmittance measurement optical system that includes the projection optical system 23 are removed from the lens surfaces and, as a result, the transmittance of the transmittance measurement optical system improves to achieve P1>P0. By connecting these two transmittances P0 and P1 with a line, the predictive line C1 of time-varying transmittance is obtained.

Figure 5:
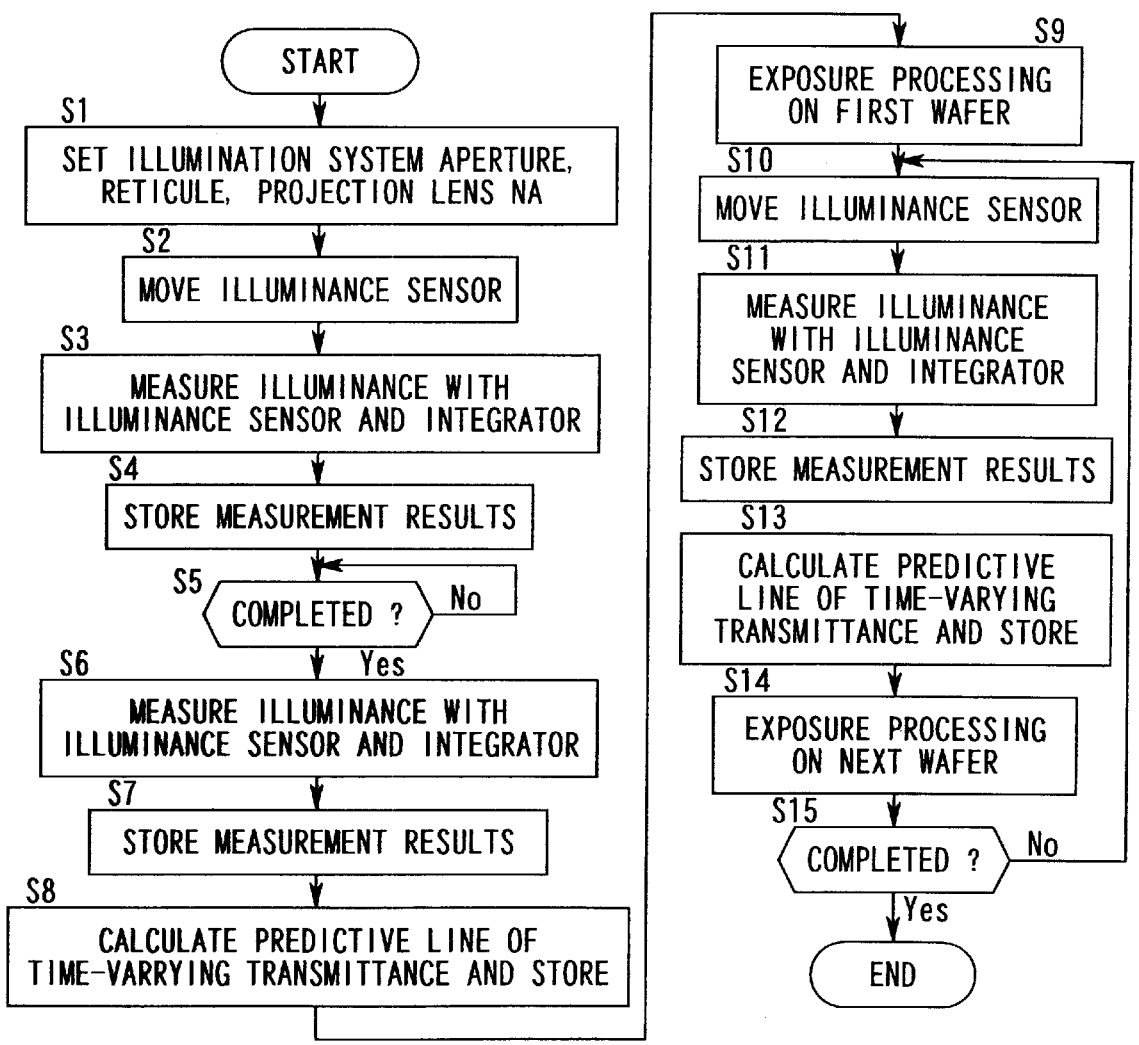
FIG. 5 is a flowchart of the procedure through which a pattern is exposed on a wafer by calculating the predictive line of time-varying transmittance.

FIG. 5 is a flowchart of the procedure through which exposure is performed while calculating a predictive line of time-varying transmittance characteristics. In step S1, the variable aperture stop at the illumination optical system, the reticule type and the numerical aperture NA at the projection optical system are determined and input. Based upon the input data, the turret plate 7 is driven by the motor 8 to rotate, the aperture stop that forms a secondary light source having a corresponding shape and size is inserted in the illumination light path, and the numerical aperture NA at the projection optical system 23 is adjusted through the aperture stop Ep. In addition, the reticule 16 that has been selected is delivered from the reticule library and is set on the reticule stage 18.

In step S2, the wafer stage 27 is moved to position the illuminance sensor 28 on the optical axis of the projection optical system 23. In step S3, the laser light source 1 is driven to emit laser light (idle emission), the illuminance LI of the exposing light reflected by the mirror 9 is detected by the integrator sensor 10 and the illuminance LW of the exposing light on the wafer stage 27 is detected by the illuminance sensor 28. In step S4, the results of these detections are stored in memory as first detected illuminances. When it is decided in step S5 that the idle emission of 20,000 pulses has been completed, the operation proceeds to step S6. In step S6, the 20,001st pulse of the pulse laser is emitted, the illuminance LI of the exposing light reflected by the mirror 9 is detected by the integrator sensor 10 and the illuminance LW of the exposing light at the wafer stage 27 is detected by the illuminance sensor 28. In step S7, the results of these detections are stored in memory as the last detected illuminances of the idle emission.

Then, in step S8, the predictive line of time-varying transmittance is calculated based upon the first detected illuminances and the last detected illuminances. This predictive line is achieved through approximation by calculating the transmittance P0 representing the ratio LW/LI of the first detected illuminances and the transmittance P1 representing the ratio LW/LI of the last detected illuminances and then connecting these points P0 and P1. This predictive line of time-varying transmittance may be stored as a linear function or may be stored in a storage device 57 which is to be detailed later as a table of transmittances relative to exposure time.

When the predictive line of time-varying transmittance C1 is determined in this manner, a first wafer 25 is placed to face opposite the optical axis of the projection optical system 23 and exposure is started in step S9 in FIG. 5. A resist, which is a photosensitive material, is applied in advance on the surface of the wafer 25 onto which the pattern at the reticule 16 is to be transferred, and the wafer 25 is delivered in this state by the wafer loading mechanism (not shown) to be placed on the wafer stage 27. The wafer 25 is aligned on the wafer stage 27 and becomes securely held. No pattern is present on the wafer 25 placed on the wafer stage 27 at the time of the first pattern transfer, and it is set at a specific position on the wafer stage 27, e.g., a position determined in correspondence to the external diameter of the wafer 25. Then, the pattern is transferred onto the wafer 25. This transfer is a scanning type transfer (step-and-scan method) in which a portion of the pattern of the reticule 16 is selectively illuminated by the variable field stop (reticule blind) 12, the reticule 16 is moved by the reticule stage 18 relative to the illumination area defined by the variable field stop 12 and the wafer 25 is moved by the wafer stage 27 relative to the projection area which is conjugate with the illumination area relative to the projection optical system 23 in synchronization with the relative movement of the reticule 16. Alternatively, the transfer may be achieved through a step-and-repeat method in which the entire pattern area on the reticule 16 to be transferred is illuminated and transferred at once.

Figure 6:
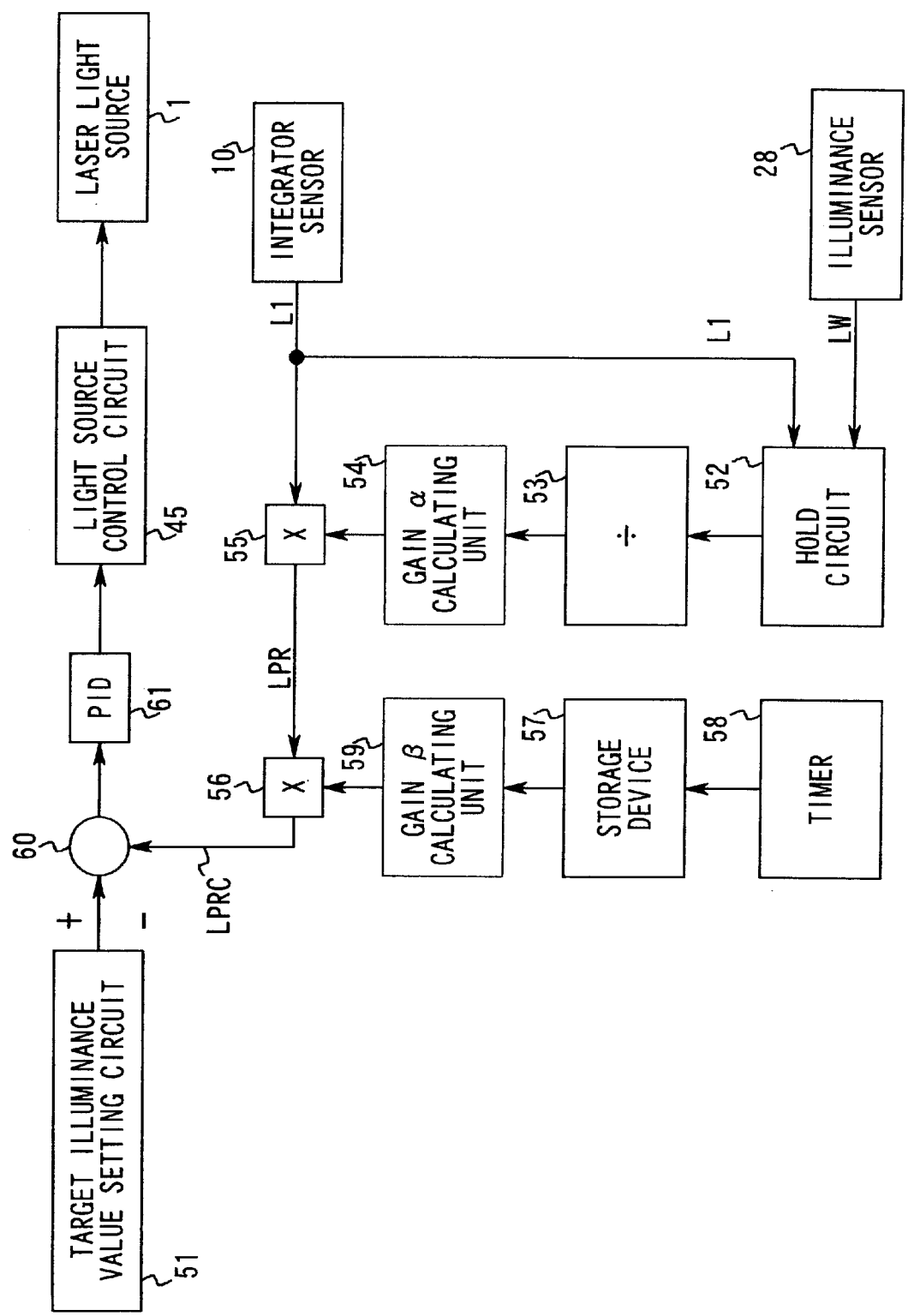
FIG. 6 is a block diagram of the feedback system employed to control the exposing light on the wafer at a target iilluminance value.

FIG. 6 is a block diagram of feedback control implemented to control the intensity of the laser light at a target illuminance on the wafer according to the present invention, which may be realized within the control circuit 40 in the form of software or hardware. The target illuminance at the wafer which is determined in correspondence to the sensitivity characteristics of the resist and the like is set at a target value setting circuit 51. As explained earlier, the integrator sensor 10 outputs the detection signal LI which corresponds to the illuminance of the exposing light made consistent by the fly-eye lens 6, and the illuminance sensor 28 outputs the detection signal LW that corresponds to the illuminance of the exposing light on the wafer stage 27. Prior to the start of an exposure operation, the illuminance sensor 28 is moved onto the optical axis AX of the projection optical system 23, and the measured value LI at the integrator sensor 10 and the measured value LW at the illuminance sensor 28 are held at a sample hold circuit 52. The ratio of the detection signal LI from the integrator sensor 10 and the detection signal LW from the illuminance sensor 28 (output LW from sensor 28/output LI from sensor 10) is calculated at a divider 53, and a gain $\alpha$ calculating unit 54 calculates the gain by multiplying LW/LI by a specific coefficient K1. Then, during the exposure operation, a multiplier 55 multiplies the output signal from the integrator sensor 10 by the gain and outputs an estimated actual illuminance LPR. In other words, when the measured value at the integrator sensor 10 is 100 and the illuminance on the wafer 25 is 50 at the start of exposure, for instance, the estimated actual illuminance LPR represents an estimated value of the illuminance at the wafer achieved by multiplying the gain, which has been calculated by multiplying the ratio 50/100 by the specific coefficient K1, by the output signal from the integrator 10, output during the exposure. Hence, the gain $\alpha$ is set as an optimal value for a situation in which there is no fluctuation in the transmittance.

The estimated actual illuminance LPR calculated by multiplying the detection signal from the integrator sensor 10 by the gain $\alpha$ at the multiplier 55 is further multiplied by a gain $\beta$ at a multiplier 56, to calculate a corrected estimated actual illuminance LPRC on the wafer. The gain $\beta$ is calculated as described below.

As explained earlier, the predictive line of time-varying transmittance that is determined in advance is stored in the storage device 57. A timer 58 measures the length of time elapsed after the start of exposure, and the storage device 57 is accessed depending upon the length of the measured time to read out the transmittance. The results of the readout are input to a gain $\beta$ calculating unit 59, which multiplies the transmittance read out by a specific coefficient K2 to calculate the gain $\beta$. For instance, when the transmittance is 80%, the gain $\beta$ is set at 0.8×K2.

The signal LPRC achieved by multiplying the detection signal from the integrator sensor 10 by the gains $\alpha$ and $\beta$ indicates an estimated value of the actual illuminance at the wafer stage 27, and is input to a deviation calculator 60. The deviation calculator 60 calculates the deviation between the target illuminance at the wafer output by the target value setting circuit 51 and the corrected estimated actual illuminance, inputs the deviation thus calculated to a PID arithmetic circuit 61 to perform a PID arithmetic operation and sends the results of the PID operation to the light source control circuit 45 to control the light source 1 or adjust its oscillation intensity.

Assuming that the pattern image is currently projected on the wafer between the time points t1 and t2 in FIG. 4, the transmittance used during the exposure operation performed between the time points t1 and t2 is calculated by using the predictive line C1 based upon the length of time elapsed during this period (exposure time).

When the exposure of the first wafer 25 is completed in step S9 (at the time point t2 in FIG. 4) in FIG. 5, a transmittance P2 is calculated from the ratio LW/LI of the illuminances detected by the integrator sensor 10 and the illuminance sensor 28 at the time point t2 in steps S10~S12, as in steps S2~S4 explained earlier, and the transmittance P2 is stored in memory before the operation proceeds to step S13. In step S13, the transmittance P1 at the time point t1 and the transmittance P2 at the time point t2 is connected as in step S8, and predictive line C2 of time-varying transmittance is calculated as shown in FIG. 4.

Next, in step S14, exposure of the next (second) wafer 25 starts. During the exposure of the second wafer, too, the transmittance is calculated based upon the length of time elapsed between the time points t2 and t3 using the predictive line C2 in a manner similar to that in which the first wafer was exposed, and the exposure quantity is controlled by using the gain β calculated in correspondence to the transmittance.

Since a pattern is present at least on the wafer 25 at the time of a second or subsequent pattern transfer onto the wafer 25, the position of the pattern that has already been transferred onto the wafer 25 is measured by employing a wafer alignment system (not shown) to measure a mark added to the pattern. Based upon the results of the measurement, the positions of the reticle stage 18 and the wafer stage 27 are controlled to achieve a specific positional relationship between the pattern that has already been transferred onto the wafer 25 and the pattern that is to be transferred.

While an idle emission of 20,001 pulses is performed between the time points t0 and t1 in the embodiment, the number of pulses in the idle emission is not limited to 20,001. In addition, while the transmittance is predicted using the predictive line of time-varying transmittance, which is achieved by connecting the two transmittances corresponding to the time points t0 and t1 and also connecting the two transmittances corresponding to the time points t1 and t2, the predictive line may be calculated using transmittances corresponding to three or more time points. The method of approximation does not need to be a linear approximation, and instead, a regression line or a regression curve that is achieved by not directly connecting the calculated transmittances may be used. The approximation may be achieved through polynomial approximation, exponential approximation, indicial approximation, modified indicial approximation or the like.

Figure 7:
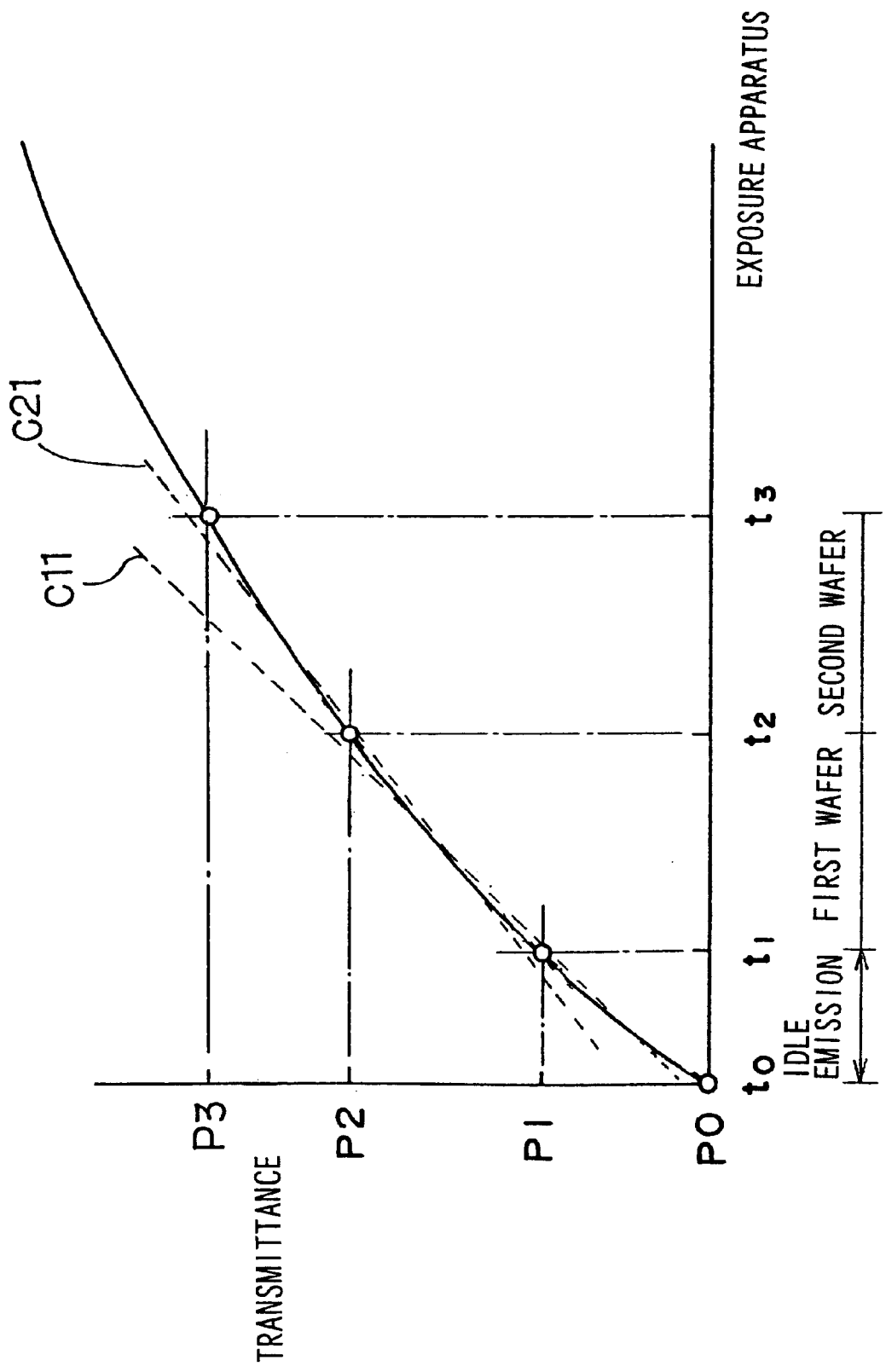
FIG. 7 presents a graph illustrating the relationship between the length of exposure period and the transmittance.

A method that may be adopted to calculate a predictive line of time-varying transmittance using transmittances corresponding to three or more points as described above is now explained in detail in reference to FIG. 7. FIG. 7, which is similar to FIG. 4, presents a predictive line C11 of time-varying transmittance calculated by using transmittances at three time points prior to the exposure of the second wafer. An approximate predictive line C11 is calculated through the method of least squares using the following formula (3), based upon three sets of data (t0, P0), (t1, P1) and (t2, P2) respectively indicating the transmittance P0 at the time point t0, the transmittance P1 at the time point t1 and the transmittance P2 at the time point t2 in FIG. 7.

$$P(t) = M \times t + I \quad (3)$$

where, $$M = \frac{\sum_{j=0}^{2}(tj - \bar{t})(Pj - \bar{P})}{\sum_{j=0}^{2}(tj - \bar{t})^2}$$

$$I = \bar{P} - M \times \bar{t}$$

$$\bar{t} = \sum_{j=0}^{2} tj$$

$$\bar{P} = \sum_{j=0}^{2} Pj$$

A transmittance P3 at a time point t3 at which the exposure of the second wafer ends is calculated as explained earlier, and before starting the exposure of a third wafer, an approximate line C21 is calculated through the method of least squares using the following formula (4), based upon three sets of data (t1, P1), (t2, P2) and (t3, P3) respectively indicating the transmittance P1 at the time point t1, the transmittance P2 at the time point t2 and the transmittance P3 at the time point t3 in FIG. 7.

$$P(t) = M \times t + I \quad (4)$$

where, $$M = \frac{\sum_{j=1}^{3}(tj - \bar{t})(Pj - \bar{P})}{\sum_{j=1}^{3}(tj - \bar{t})^2}$$

$$I = \bar{P} - M \times \bar{t}$$

$$\bar{t} = \sum_{j=1}^{3} tj$$

$$\bar{P} = \sum_{j=1}^{3} Pj$$

Subsequently, predictive line of time-varying transmittance is calculated using the most recent three sets of data as described above when exposing a fourth and subsequent wafers as well and the exposure control is implemented in conformance to the predictive line of time-varying transmittance.

Figure 8:
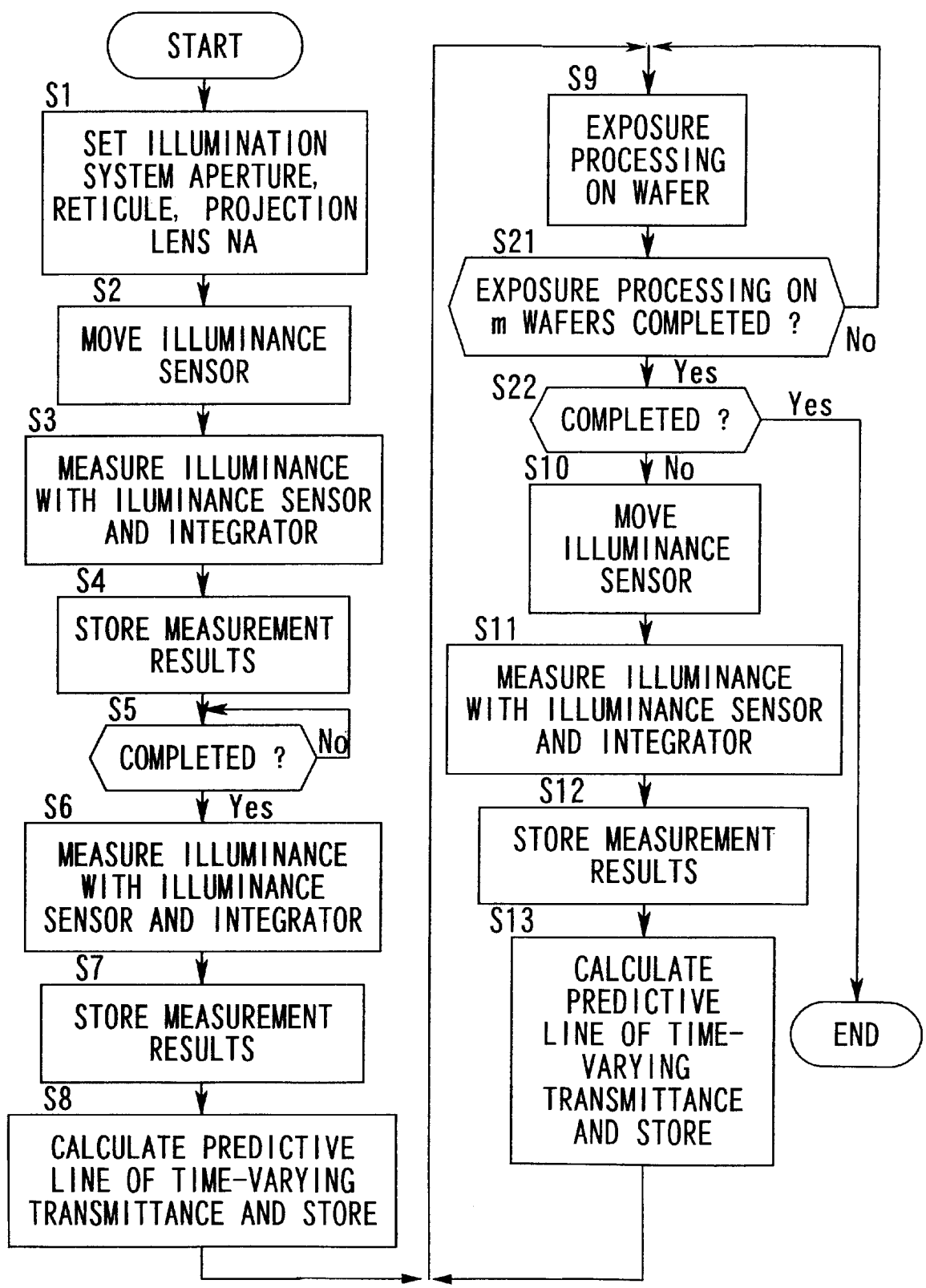
FIG. 8 is a flowchart of another example of the procedure through which a pattern is exposed on a wafer by calculating the predictive line of time-varying transmittance.

In addition, while the predictive line of time-varying transmittance is calculated after the exposure of the first wafer ends by measuring the transmittance before the exposure of the next wafer starts, a predictive line may be calculated in units of two wafers, three wafers or the like if error can be tolerated. In other words, the exposure quantity control may be implemented by using a transmittance calculated in conformance to a common predictive line that pertains to a plurality of wafers. FIG. 8 is a flowchart of an exposure procedure implemented in such a case.

FIG. 8 is a flowchart of an example of a procedure that may be implemented when exposure is performed by calculating a predictive line of time-varying transmittance every plurality of wafers instead of every wafer. By assigning the same reference numbers to steps identical to those in FIG. 5, the explanation will mainly focus on differences from the flowchart in FIG. 5. The predictive line of time-varying transmittance calculated in step S8 is commonly used until it is decided in step S21 that exposure processing has been performed on m wafers. If it is decided in step S21 that the exposure processing on the m wafers has been completed, a decision is made in step S22 as to whether or not the entire exposure processing has been completed. If it is decided that the entire processing has been completed, all the processing in FIG. 8 ends. If a negative decision is made in step S22 and exposure processing is to be executed on a wafer continuously, a new predictive line of time-varying transmittance is calculated using the previous transmittance and the current transmittance in steps S10 S13. Then, the operation proceeds to step S9, in which exposure processing is performed while implementing exposure quantity control using the new predictive line of time-varying transmittance.

Thus, since a predictive line of time-varying transmittance is calculated every plurality of wafers if fluctuations in the transmittance are not great in the procedure in FIG. 8, exposure can be performed at a correct exposure quantity with a high degree of accuracy without greatly reducing the throughput.

Figure 9:
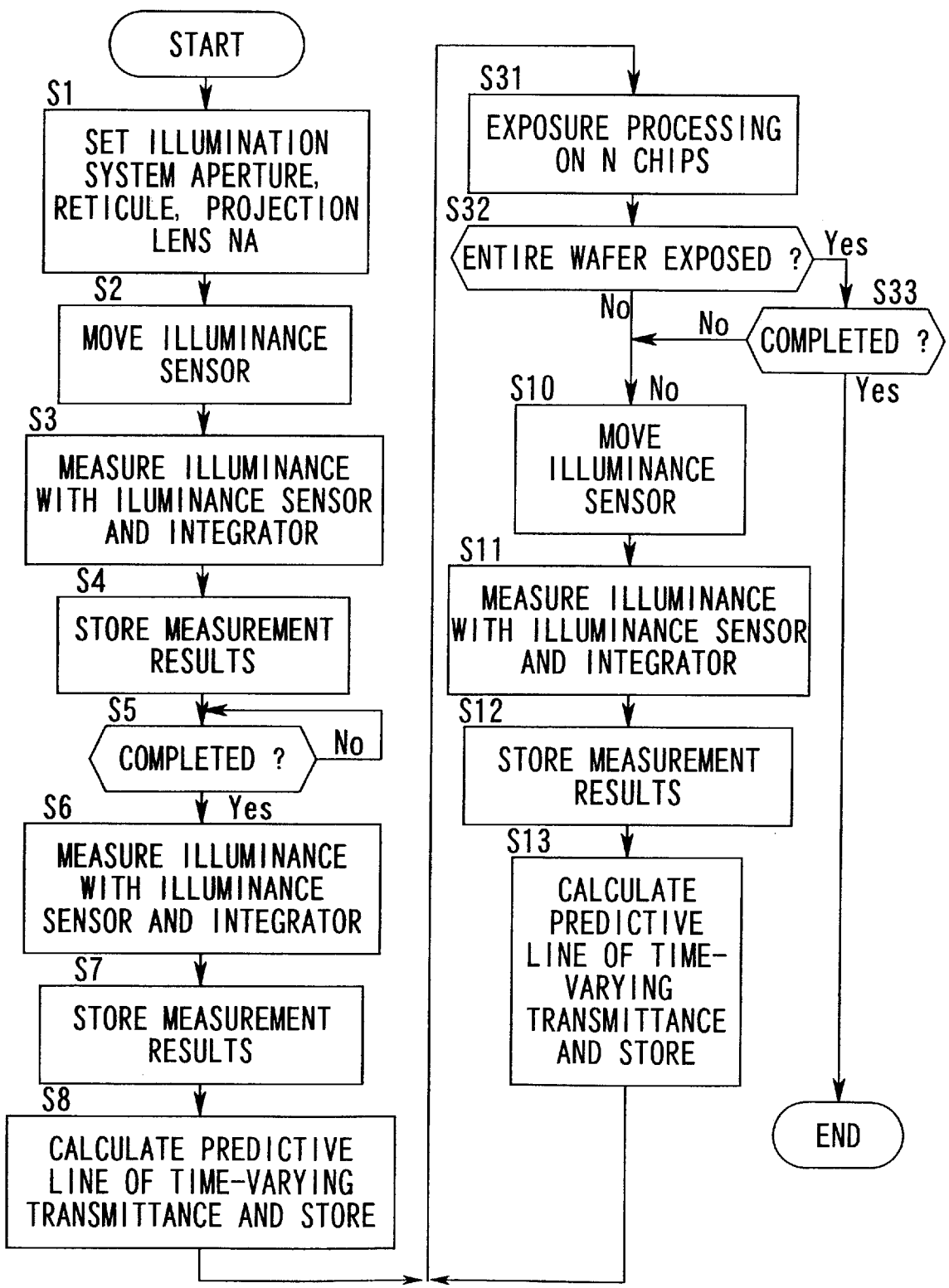
FIG. 9 is a flowchart of yet another example of the procedure through which a pattern is exposed on a wafer by calculating the predictive line of time-varying transmittance.

If the transmittance fluctuates to an unacceptable degree while exposing a single wafer, it is desirable to calculate a predictive line every chip or every two chips. FIG. 9 is a flowchart of an exposure procedure that may be implemented in such a case.

FIG. 9 is a flowchart of an example of a procedure that may be implemented when exposure is performed by calculating a predictive line of time-varying transmittance every N chips on a given wafer instead of every wafer. By assigning the same reference numbers to steps identical to those in FIG. 5, the explanation will mainly focus on differences from the flowchart in FIG. 5. The predictive line of time-varying transmittance calculated in step S8 is commonly used until exposure processing on N chips is determined to be completed in step S31. A decision is made in step S32 as to whether or not the exposure processing on the given wafer has been completed. If a negative decision is made, a new predictive line of time-varying transmittance is calculated using the previous transmittance and the current transmittance in steps S10~S13. Then the operation proceeds to step S31, in which exposure processing is performed on the next N chips while implementing exposure quantity control using the new predictive line of time-varying transmittance. If it is decided in step S32 that the exposure processing on the given wafer has been completed, a decision is made in step S33 as to whether or not the entire exposure processing has been completed. If it is decided that the entire processing has been completed, all the processing in FIG. 9 ends. If a negative decision is made in step S33 and exposure processing is to be executed on a new wafer continuously, the operation proceeds to step S10~S13 to calculate a new predictive line of time-varying transmittance and then the processing in step S31 and in subsequent steps is executed. Thus, since a predictive line of time-varying transmittance is calculated for every N chips that are being exposed on a single wafer when fluctuations in the transmittance are great, exposure can be performed at a correct exposure quantity with a high degree of accuracy. It is to be noted that the number of chips that use a common predictive line of time-varying transmittance should be set at value equal to 1 or greater as appropriate.

Figure 10:
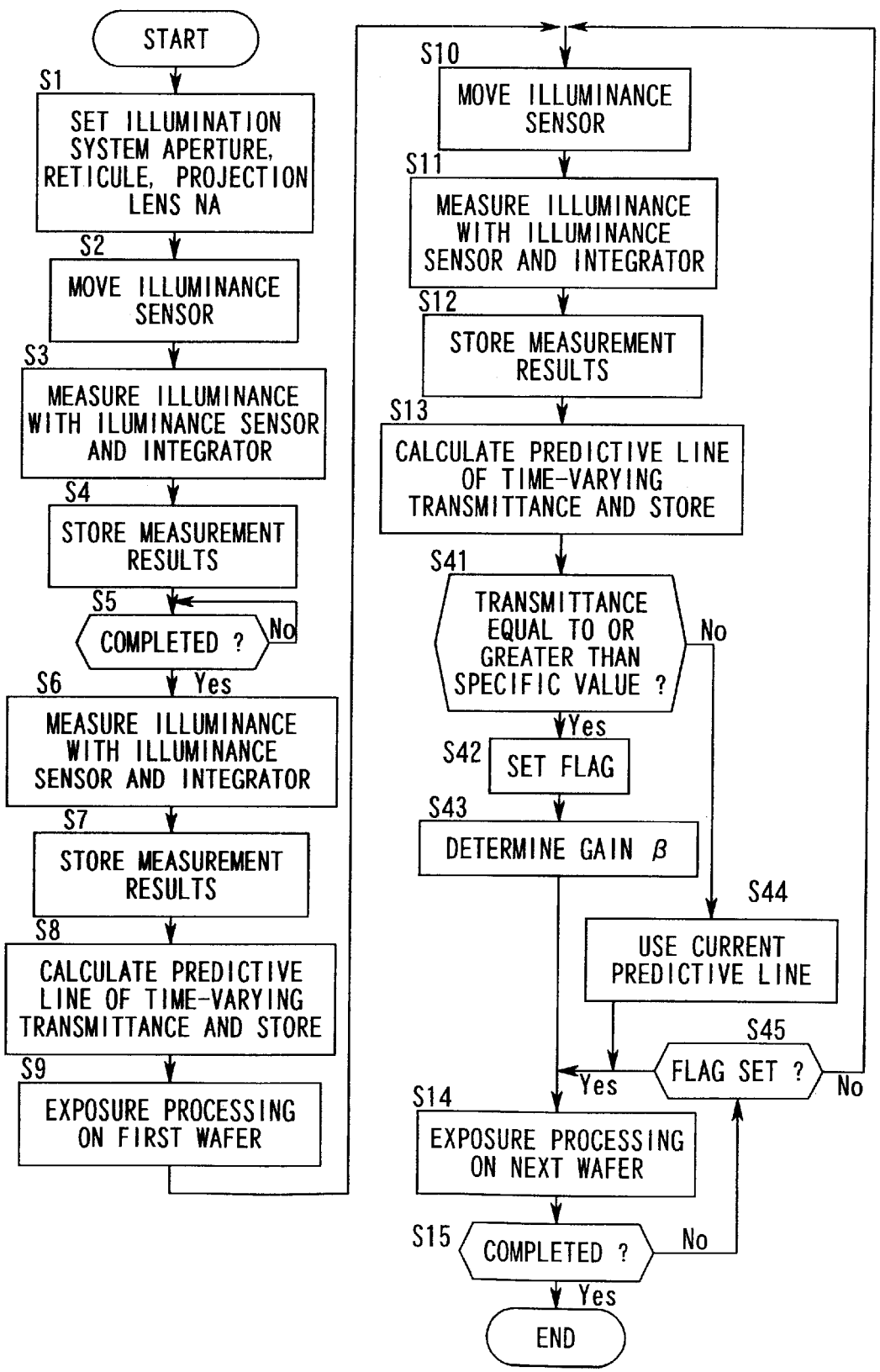
FIG. 10 is a flowchart of yet another example of the procedure through which a pattern is exposed on a wafer by calculating the predictive line of time-varying transmittance.

Furthermore, if fluctuations in the transmittance become small enough to be tolerated, the exposure quantity control using a predictive line of time-varying transmittance may be stopped. FIG. 10 is a flowchart of an exposure procedure that may be implemented in such a case. By assigning the same reference numbers to steps identical to those in FIG. 5, explanation will mainly focus on differences from FIG. 5.

In FIG. 10, unless it is decided in step S41 that the transmittance is equal to or greater than a preset reference value, the operation proceeds to step S44, and by using the predictive line of time-varying transmittance which has been calculated immediately before, exposure processing on the next wafer is performed in step S14. If it is decided in step S41 that the transmittance is equal to or greater than the preset reference value, the operation proceeds to step S42 to set the flag, and then in step S43, the value of the gain $\beta$ is determined by assuming that there will be no subsequent time-varying transmittance. For instance, as explained earlier in reference to FIG. 6, in case that the gain $\beta$ is determined by multiplying the coefficient K2 by the transmittance, a specific transmittance determined in step S41 is used to determine the gain $\beta$. Then, exposure processing is performed on the next wafer in step S14 and if it is decided in step S15 that the entire exposure processing has not been completed as yet, a decision is made in step S45 with respect to the status of the flag. If the flag is set, the operation proceeds to step S14, whereas if it is not set, the operation proceeds to step S10.

Thus, by implementing the procedure in FIG. 10, which does not require calculation of a predictive line of time-varying transmittance when the transmittance is equal to or greater than a specific value, the length of processing time can be reduced to achieve an improvment in throughput.

It is necessary to bear in mind the following points when measuring the illuminance at the wafer 25 with the illuminance sensor 28. The transmittance at the reticule is affected by the pattern density at the reticule 16, and if the position of the reticule changes every time the illuminance sensor 28 measures the illuminance at the wafer 25, the transmittance cannot be measured accurately. Thus, it is necessary to set the reticule 16 at the same position on the reticule stage 18 when measuring the illuminance at the wafer 25 with the illuminance sensor 28.

In addition, the transmittance at a so-called white reticule having a low ratio of the pattern area (the area corresponding to the light blocking portion (chrome)) against the reticule surface area (the area corresponding to the rectangular portion where the pattern is formed) greatly differs from the transmittance at a so-called black reticule, having a high ratio of the pattern area against the reticule surface area. Since the transmittance of the exposing light being irradiated is small at a black reticule, the quantity of light entering the illuminance sensor 28 may be below the sensitivity threshold of the sensor 28. In this case, the illuminance on the wafer 25 effectively cannot be measured, and therefore, a predictive line of time-varying transmittance cannot be calculated.

Figure 11:
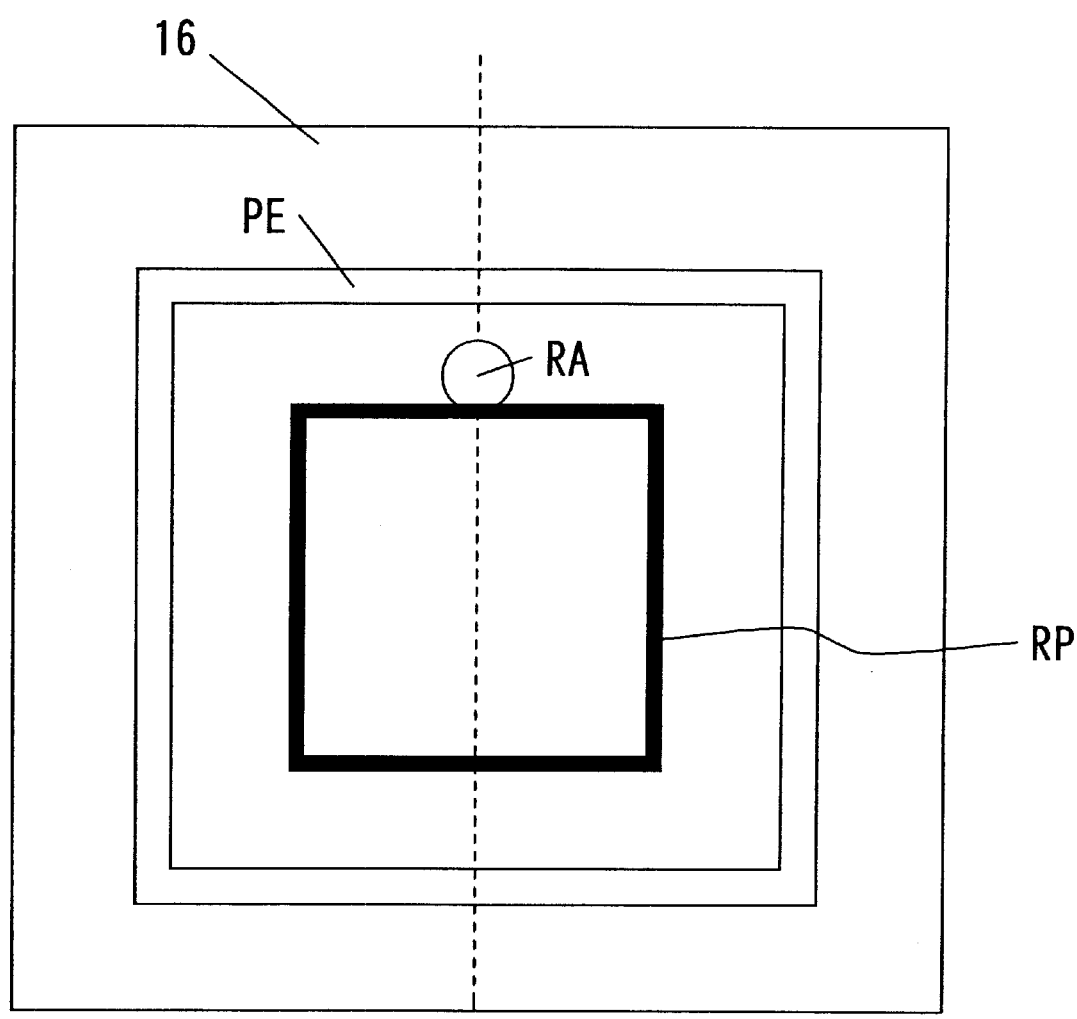
FIG. 11 is a plan view of a reticule provided with a pericle in which a transparent area for measurement is formed.

As a solution, a reticule 16 having a transparent area for measurement RA formed outside the reticule pattern area RP, as illustrated in FIG. 11, may be used to measure the illuminance at the wafer stage by moving the illuminance sensor 28 to a position that is conjugate with the transparent area RA relative to the projection optical system 23 when measuring the illuminance at the wafer 25. PE indicates the position at which the pericle frame is located. The shape and the quantity of the transparent area are not limited to those in the example in FIG. 11. It is to be noted that the illuminance sensor 28 may be placed at a position that is conjugate with an area of the reticule 16 where the pattern density is low relative to the projection optical system 23 without using the transparent area RA. Alternatively, an opening through which the illumination light passes may be provided at the reticule stage itself. Or a measurement may be performed by the illuminance sensor 28 by causing the reticule stage 18 to completely move away from the illumination light path.

(Second embodiment in which exposure processing is performed based upon pre-stored time-varying transmittance characteristics)

While exposure processing is performed by predicting time-varying transmittance characteristics in the first embodiment explained above, in the second embodiment, exposure processing is performed using time-varying transmittance characteristics that are stored in memory prior to exposure.

Since the entire structure of the exposure apparatus and the circuit that sets the exposing light at a target value are identical to those illustrated in FIG. 1 or FIG. 6, a detailed explanation thereof is omitted. It is to be noted that the method for setting time-varying transmittance characteristics to be stored in the storage device 57 in FIG. 6 in the second embodiment differs from the method employed in the first embodiment. Thus, the method for setting time-varying transmittance characteristics stored in the storage device 57 in FIG. 6 is first explained.

Figure 12:
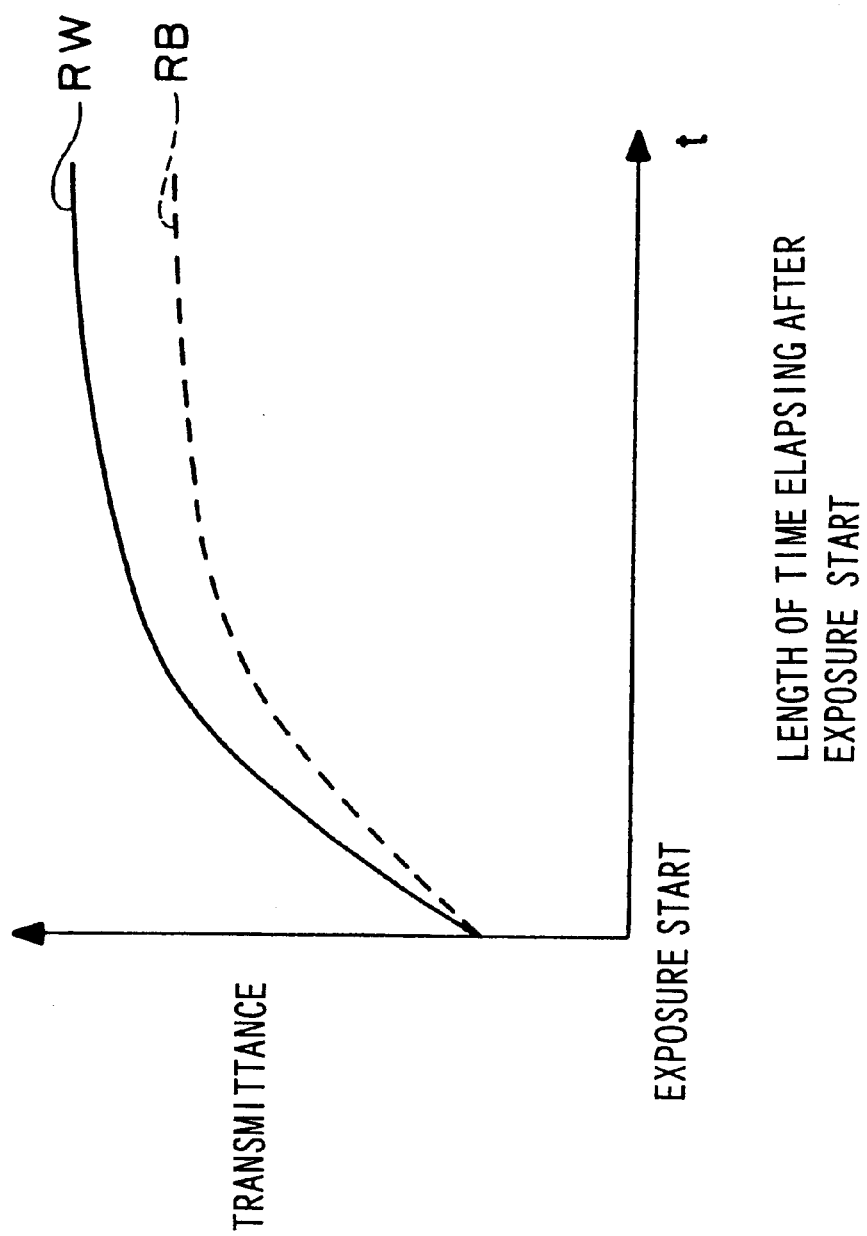
FIG. 12 is an explanatory view illustrating time-varying transmittance characteristics that vary in correspondence to the type of reticule.

The contents of memory in the storage device 57 are now explained. FIG. 12 illustrates time-varying transmittance characteristics at the projection optical system 23 in correspondence to different types of reticules, with the solid line RW representing the characteristics of a so-called white reticule having a low ratio of the pattern area (the area of the light blocking portion (chrome)) against the reticule surface area (the area of the rectangular portion where the pattern is formed) and the broken line RB representing the characteristics of a so-called black reticule having a high ratio of pattern area against reticule surface area. Since the white reticule achieves a larger transmittance of the exposing light illuminating the reticule compared to the black reticule, it demonstrates excellent self-cleaning effect on the projection optical system 23, manifests a steeper rise of the transmittance compared to the black reticule and tends to have a higher transmittance saturation level.

Different tendencies manifest in the time-varying transmittance characteristics in correspondence to varying exposure conditions as well as in correspondence to different types of reticules in use. When the aperture stops 7e, 7f and 7g for regular illumination are used at the variable aperture stop device, tendencies represented by the solid line 7g, the one-point chain line 7f and the broken line 7e in FIG. 13 manifest. In the figure, the solid line T7e represents the characteristics achieved by using the aperture stop 7e, the one-point chain line T7f represents the characteristics achieved by using the aperture stop 7f and the broken line T7g represents the characteristics achieved by using the aperture stop 7g. It is to be noted that the size of σ corresponds to the size of the aperture stop as long as the numerical aperture NA at the projection optical system 23 is constant, and the aperture stops 7g, 7f and 7e in FIG. 13 correspond to a large σ, a medium σ and a small σ respectively. While the time-varying characteristics manifest different tendencies in correspondence to the numerical apertures NA at the projection optical system 23 as well, a tendency whereby steeper rise characteristics and a higher transmittance saturation is observed when the numerical aperture NA is large, since the exposing light entering the optical system located toward the wafer relative to the aperture stop Ep in the projection optical system becomes greater.

Since the time-varying transmittance characteristics are different between the ring band openings 7c and 7d at the turret plate 7 for a modified illumination in correspondence to the internal diameters and the external diameters of the ring bands, these characteristics are measured and stored in advance.

Figure 13:
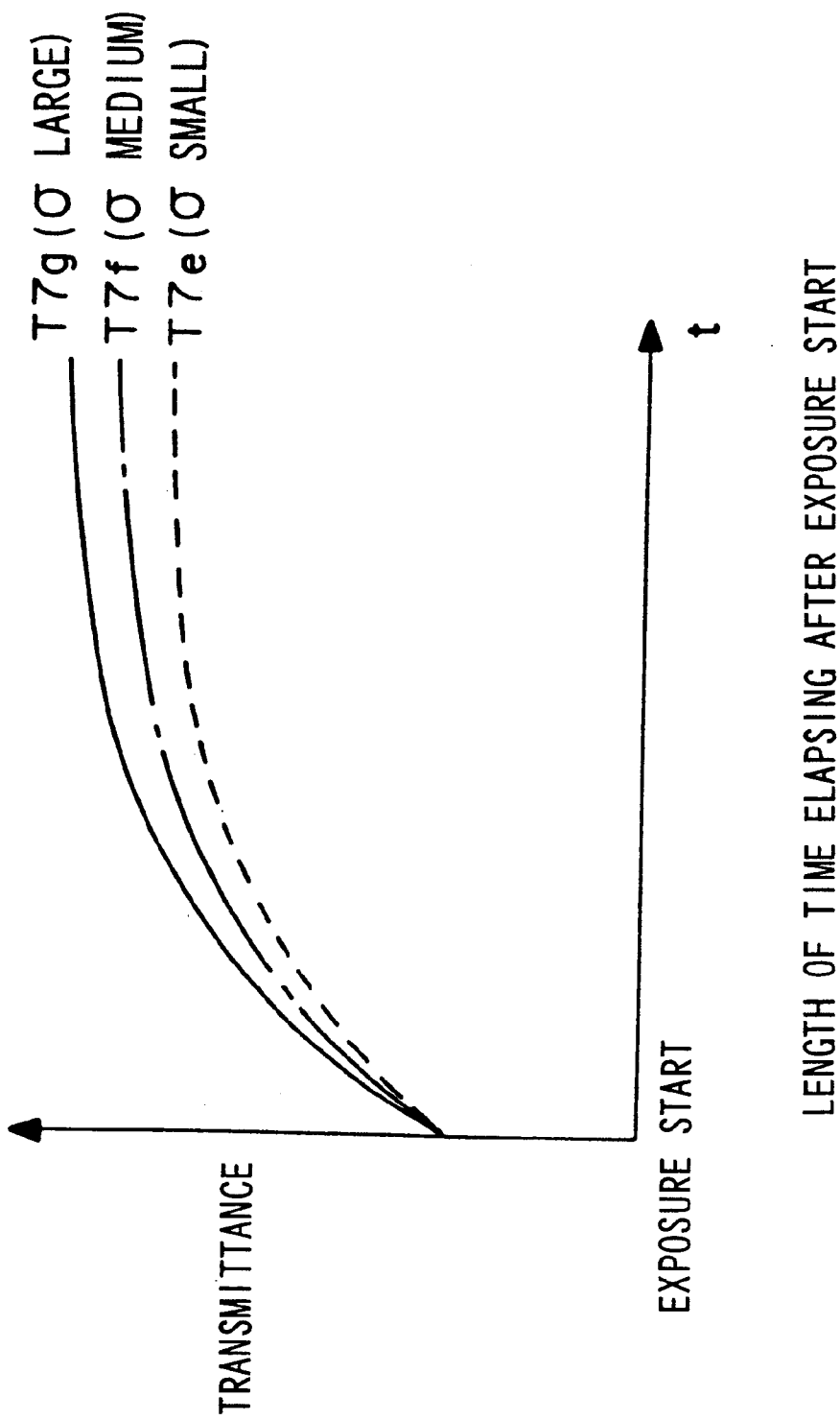
FIG. 13 is an explanatory view illustrating time-varying transmittance characteristics in correspondence to the size of the variable aperture stop.

The time-varying transmittance characteristics in FIGS. 12 and 13 that are obtained through advance measurement performed under various exposure conditions are stored together with sample time points in the storage device 57 in FIG. 6, and when a specific exposure conditions are determined, the table that corresponds to the exposure conditions is referenced to read out the transmittance in accordance with the length of time elapsed after the start of the exposure operation.

The conditions under which the wafer 25 is to be exposed using the image of the pattern at the reticule 16 is constituted of a combination of the type of pattern, the intensity distribution of the secondary light sources constituted of a plurality of light source images (shape and size), which is the condition under which the reticule is illuminated that is determined in correspondence to the pattern type, and the numerical aperture at the projection optical system 23 determined in correspondence to the pattern type.

If the exposure conditions do not match any of the exposure conditions stored in advance at the storage device 57, the table of the closest exposure condition may be used to calculate the transmittance through an interpolation operation. For instance, if the ratio of pattern area against reticule surface area is halfway between the ratio achieved by a white pattern and that achieved by a black pattern, the transmittance can be determined by correcting the transmittance read from the time-varying transmittance characteristics of either the white pattern or the black pattern in correspondence to the rate of pattern area ratio.

The time-varying transmittance characteristics are explained above in reference a situation in which exposure condition factors change within a single exposure condition. However, there are bound to be a numerous exposure conditions resulting from optimal combinations of a plurality of types of individual exposure conditions, including reticule type, the illumination method adopted at the illumination optical system, the numerical aperture at the projection optical system and the like. Thus, it is difficult to measure in advance time-varying characteristics in correspondence to all conceivable exposure conditions. As a result, in reality, time-varying characteristics are measured in correspondence to a plurality of typical exposure conditions, and if the actual exposure conditions do not fit any of the exposure conditions stored in the storage device 57, the gain β is calculated through an interpolation operation to predict the time-varying transmittance characteristics under the particular exposure conditions.

Time-varying transmittance characteristics are measured and stored in correspondence to a plurality of exposure conditions each constituted of a combination of factors, i.e., the reticule type, the shape and size of the secondary light sources (the illumination condition) and the numerical aperture at the projection optical system 23 in this example. However, the exposure conditions do not need to be constituted of a combination of these three factors. Instead, at least two of these three factors, e.g., the reticule type and the illumination condition may be combined to constitute a single exposure condition and a plurality of such exposure conditions may be measured and stored.

Next, the operation achieved in the embodiment is explained. First, as illustrated in FIG. 1, inert gas such as dry nitrogen is supplied from the gas supply device 41 into the projection optical system 23 via the pipe 43. When the projection optical system is fully charged with inert gas, the gas in the projection optical system 23 is discharged to the outside via the pipe 44 by the discharge device 42. The entire optical path through which the exposing light travels in the illumination optical system, too, is designed to be a sealed structure as in the projection optical system 23, and likewise, inert gas such as dry nitrogen is supplied and charged into the illumination optical system in a similar manner and the gas inside the optical system is discharged by the discharge device.

It is desirable to hold the atmosphere among optical elements such as lens chambers in a dry, cleaned state at all times by operating the gas supply device 41 and the discharge device 42 during exposure. However, the supply device 41 and the discharge device 42 may be stopped after replacing the gas in the spaces formed between the optical elements such as the lens chambers prior to the exposure operation. The same principle applies with respect to the illumination optical system.

Next, employing a reticle loading mechanism (not shown), the reticle 16 on which a pattern to be transferred is drawn is delivered and placed onto the reticle stage 18. At this time, the position of the reticle 16 is measured with a reticle alignment system (not shown) and the reticle 16 is set at a specific position with a reticle position control circuit (not shown) based upon the results of the measurement.

A resist, which is a photosensitive material, is applied in advance on the surface of the wafer 25 onto which the pattern at the reticle 16 is to be transferred, and the wafer 25 is delivered in this state by a wafer loading mechanism (not shown) to be placed on the wafer stage 27. The wafer 25 is aligned on the wafer stage 27 and becomes securely held. No pattern is present on the wafer 25 placed on the wafer stage 27 at the time of the first pattern transfer, and it is set at a specific position on the wafer stage 27, e.g., a position determined in correspondence to the external diameter of the wafer 25. Then, the pattern is transferred onto the wafer 25. This transfer is the so-called scanning type transfer (step-and-scan method) in which a portion of the pattern of the reticle 16 is selectively eliminated by the variable field stop (reticle blind) 12, moving the reticle 16 with the reticle stage 18 relative to the illumination area defined by the variable field stop 12 and the wafer 25 is moved by the wafer stage 27 relative to the projection area which is conjugate with the illumination area relative to the projection optical system 23 in synchronization with the relative movement of the reticle 16. Alternatively, the transfer may be achieved through a step-and-repeat method in which the entire pattern area on the reticle 16 to be transferred is illuminated and transferred at once.

Since a pattern is present at least on the wafer 25 at the time of a second or subsequent pattern transfer onto the wafer 25, the position of the pattern that has already been transferred on the wafer 25 is measured by employing a wafer alignment system (not shown) to measure a mark added to the pattern and based upon the results of the measurement, the positions of the reticle stage 18 and the wafer stage 27 are controlled to achieve a specific positional relationship between the pattern that has already been transferred onto the wafer 25 and the pattern to be transferred.

To continue with the explanation given in reference to FIG. 6, prior to the start of an exposure operation, the illuminance sensor 28 is moved onto the optical axis AX of the projection optical system 23, and the measured value LI at the integrator sensor 10 and the measured value LW at the illuminance sensor 28 are held at the sample hold circuit 52. The ratio of the detection signal LI from the integrator sensor 10 and the detection signal LW from the illuminance sensor 28 (output LW from sensor 28/output LI from sensor 10) is calculated at the divider 53, and the gain $\alpha$ calculating unit 54 calculates the gain $\alpha$ by multiplying LW/LI by a specific coefficient K1. Then, during the exposure operation, the multiplier 55 multiplies the output signal from the integrator sensor 10 by the gain $\alpha$ and outputs an estimated actual illuminance LPR. In other words, when the measured value at the integrator sensor 10 is 100 and the illuminance on the wafer 25 is 50 at the start of exposure, for instance, the estimated actual illuminance LPR represents an estimated value of the illuminance at the wafer achieved by multiplying the gain $\alpha$, which has been calculated by multiplying the ratio 50/100 by the specific coefficient K1, by the output signal from the integrator 10, output during the exposure.

The estimated actual illuminance LPR calculated by multiplying the detection signal from the integrator sensor 10 by the gain $\alpha$ at the multiplier 55 is further multiplied by a gain $\beta$ at the multiplier 56, to calculate a corrected estimated actual illuminance LPRC on the wafer. The gain $\beta$ is calculated as described below.

The storage device 57, having stored the time-varying transmittance characteristics at the illumination optical system and the projection optical system determined in advance, is accessed according to a specific length time elapsed after the start of exposure measured by the timer 58 to read out the transmittance. The results of the readout are input to the gain $\beta$ calculating unit 59, which multiplies the transmittance readout by a specific coefficient K2 to calculate the gain $\beta$. For instance, when the transmittance is 80%, the gain $\beta$ is set at 0.8×K2.

The signal LPRC achieved by multiplying the detection signal from the integrator sensor 10 by the gains $\alpha$ and $\beta$ indicates an estimated value of the actual illuminance at the wafer stage 27, and is input to the deviation calculator 60. The deviation calculator 60 calculates the deviation between the target illuminance at the wafer output by the target value setting circuit 51 and the corrected estimated actual illuminance, inputs the deviation thus calculated to the PID arithmetic circuit 61 to perform a PID arithmetic operation and sends the results of the PID arithmetic operation to the light source control circuit 45 to control the light source 1 or adjust its oscillation intensity.

Figure 14:
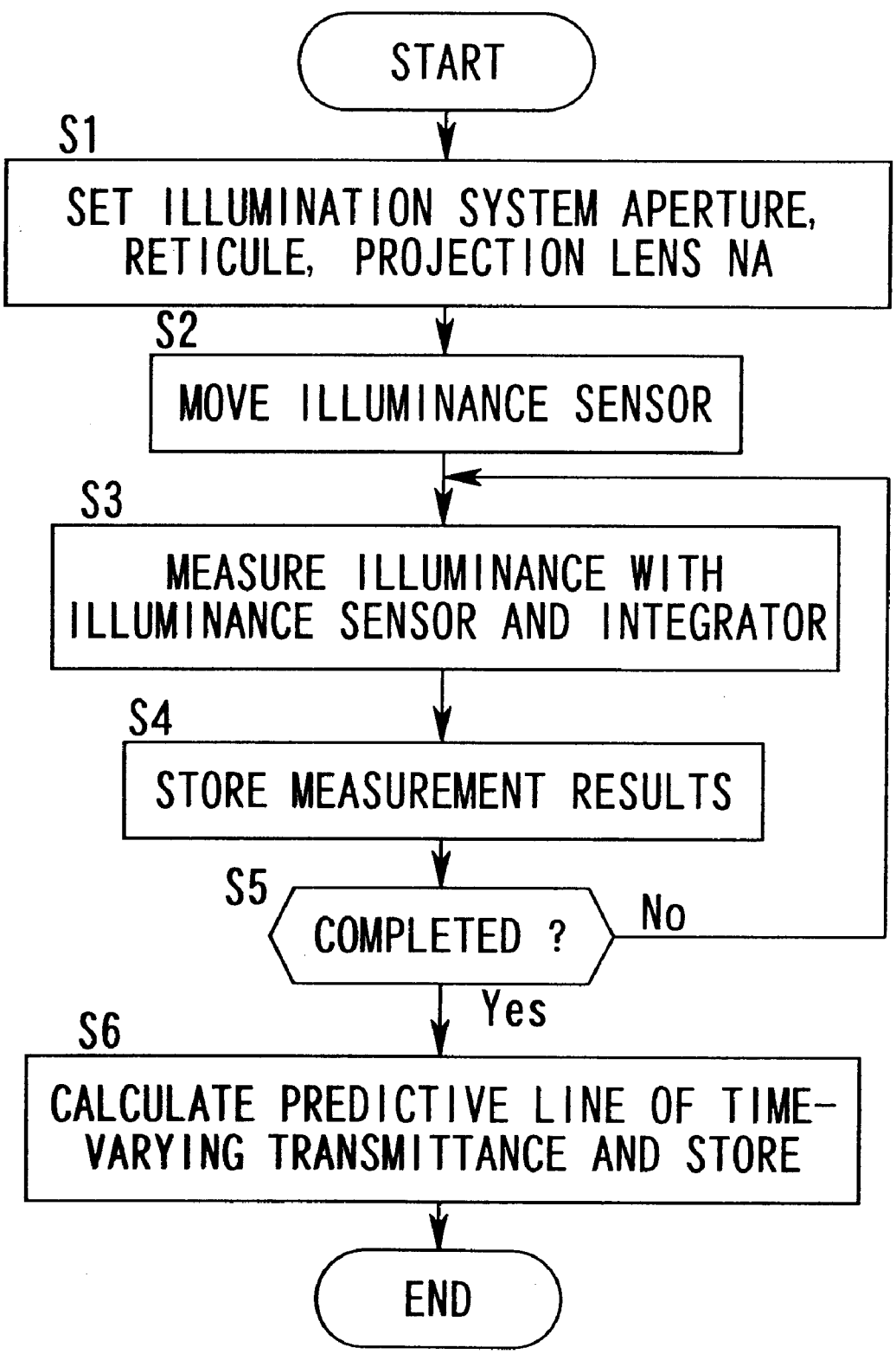
FIG. 14 is a flowchart of the procedure implemented to store in advance the time-varying transmittance characteristics in correspondence to exposure conditions.

A procedure that may be implemented to store time-varying transmittance characteristics obtained through advance measurement in the storage device 57 is explained in reference to FIG. 14. In step S1, the variable aperture stop at the illumination optical system, the reticle type and the numerical aperture NA at the projection optical system are determined and input. Based upon the input data, the turret plate 7 is driven by the motor 8 to rotate, the aperture stop that forms secondary light sources having the shape and the size corresponding to its type is inserted in the illumination light path, and the numerical aperture NA at the projection optical system 23 is adjusted through the aperture stop Ep. In addition, the reticle 16 that has been selected is delivered from the reticle library and is set on the reticle stage 18.

In step S2, the wafer stage 27 is moved to position the illuminance sensor 28 on the optical axis of the projection optical system 23. In step S3, the laser light source 1 is driven to emit laser light, the illuminance of the exposing light at the illumination optical system is detected by the integrator sensor 10 and the illuminance of the exposing light on the wafer stage 27 is detected by the illuminance sensor 28. In step S4, the results of these detections are stored in memory together with the measuring time point. Steps S3 and S4 are repeated until it is decided in step S5 that the measurement has been completed, and when it is decided in step S5 that the measurement has been completed, the program goes to step S6 in which the transmittances corresponding to the individual measuring time points are calculated and stored in memory based upon the detection results obtained at the integrator sensor 10 and the detection results obtained at the illuminance sensor 28 through the measurement. Thus, a table representing the time-varying characteristics as illustrated in FIG. 12 or FIG. 13 is stored in memory.

Figure 15:
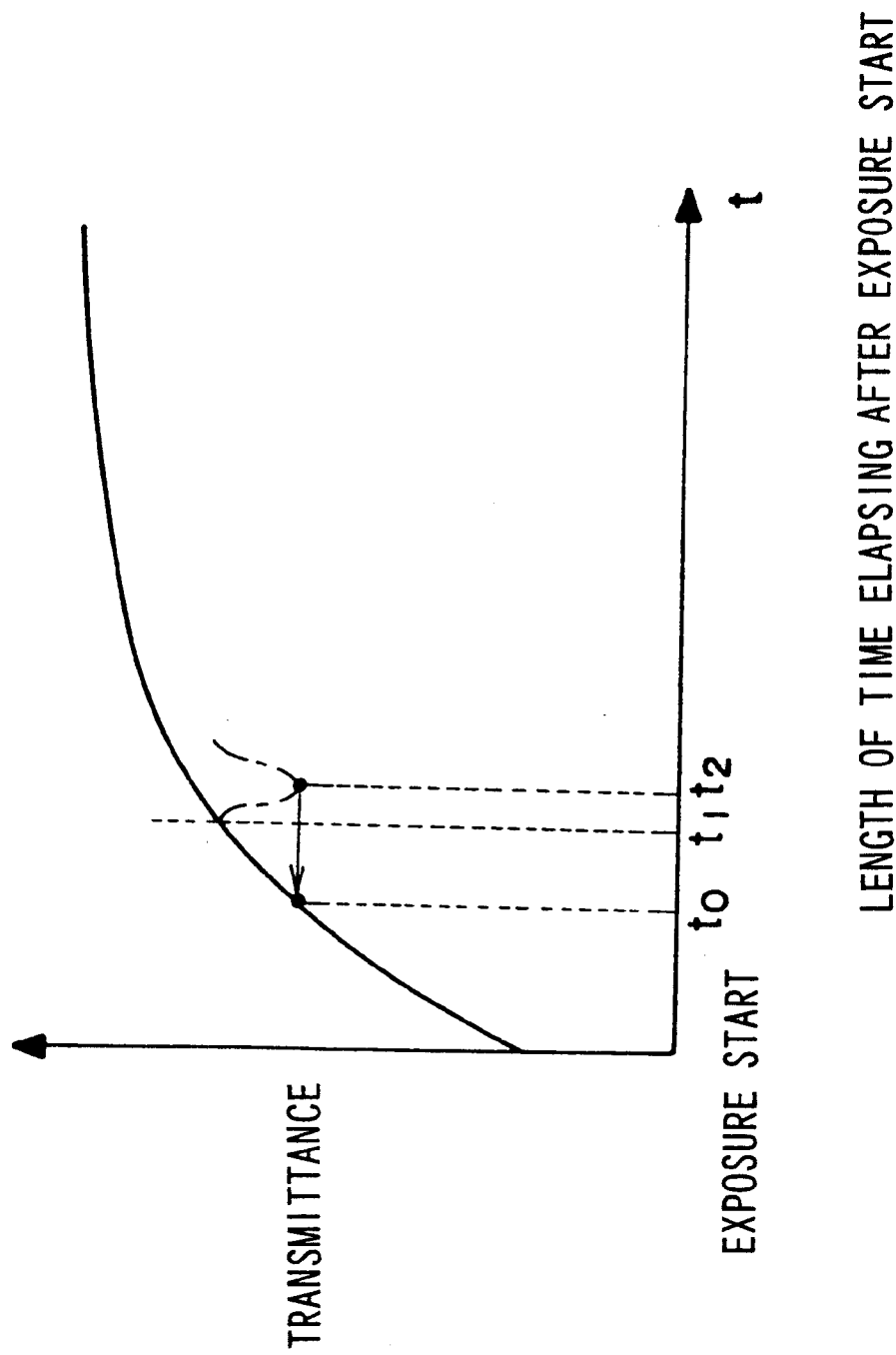
FIG. 15 is an explanatory view illustrating the transmittance measured after an exposure operation which has been interrupted due to wafer replacement is resumed.

Next, an interruption in an exposure operation due to a wafer replacement or the like is explained in reference to FIG. 15. In FIG. 15, changes in the characteristics of transmittance occuring over time when a wafer delivery starts at a time point t1, a delivery of the next wafer ends and an exposure operation start at a time point t2 is indicated by the one-point chain line. As the laser light irradiation is interrupted at the time point t1, the self-cleaning of the projection optical system 23 and the illumination optical system is interrupted as well. As a result, suspended contaminants within the projection optical system 23 and the illumination optical system become re-adhered to the surfaces of the optical elements in the optical systems or the transmittances (of the optical materials) of the optical elements themselves fluctuate to result in a reduction in the transmittances of the projection optical system 23 and the illumination optical system. When the laser light irradiation is resumed at the time point t2, self-cleaning of the optical elements starts again to result in an increase in the transmittances.

Thus, at the time point t2 at which the laser light irradiation is resumed, the illuminance sensor 28 is moved onto the optical axis of the projection optical system 23 to measure the illuminance of the exposing light at the wafer stage 27 and, at the same time, the illuminance of the exposing light at the illumination optical system is detected by the integrator sensor 10. The transmittance at the time point t2 is calculated based upon the results of the measurement at the two sensors, and a time point to that corresponds to the transmittance is determined based upon the time-varying transmittance characteristics represented by the solid line. Then, when the exposure is resumed, the timer 58 that measures the length of exposure time elapsing after the exposure start is reset at the time point to. Consequently, when the exposure operation starts, the storage device 57 references the table representing the time-varying transmittance characteristics in FIG. 15 to calculate the gain β by reading out the data corresponding to the length of time counted on the timer 58.

Figure 16:
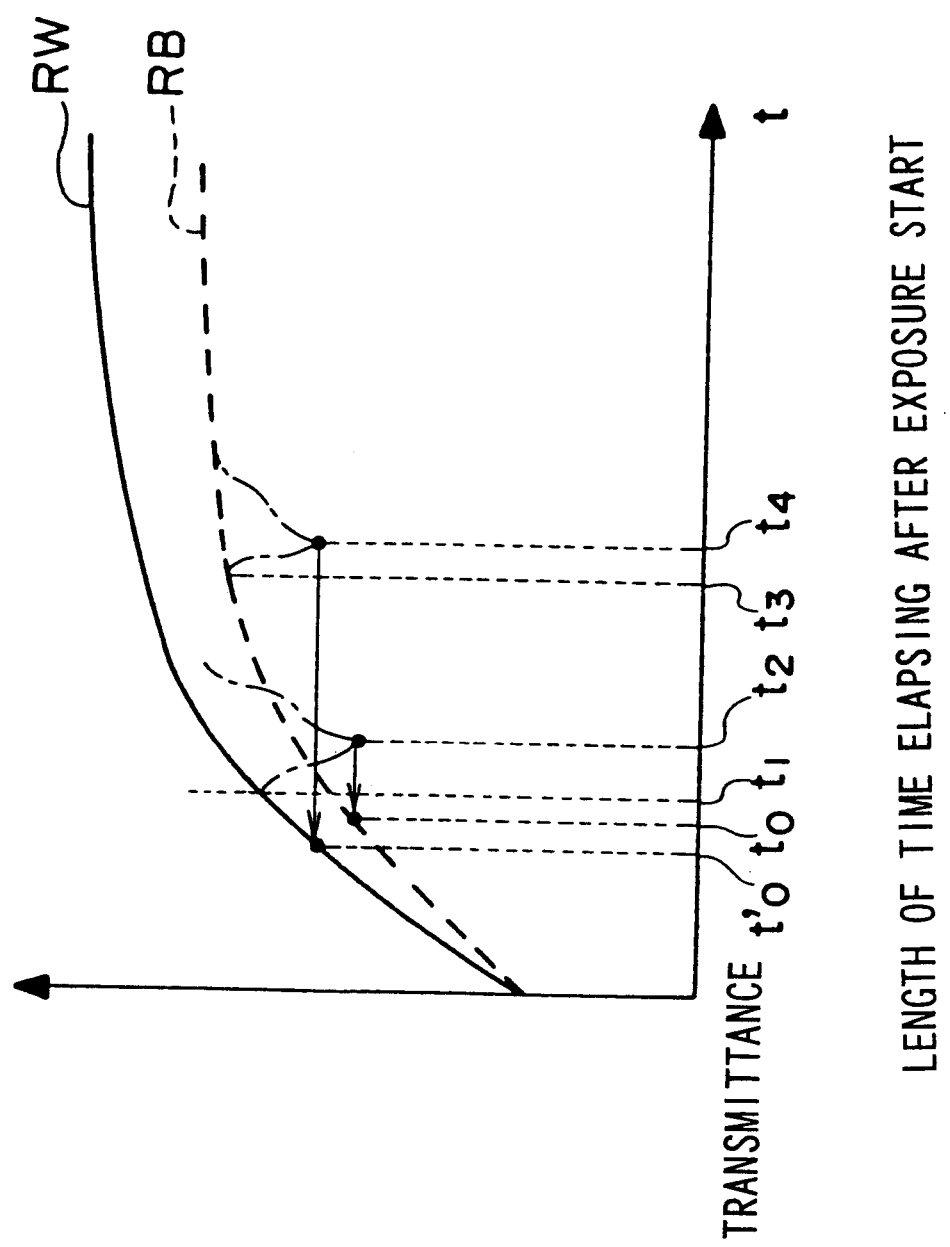
FIG. 16 is an explanatory view illustrating the transmittance measured after an exposure operation which has been interrupted due to reticule replacement is resumed.
Figure 17:
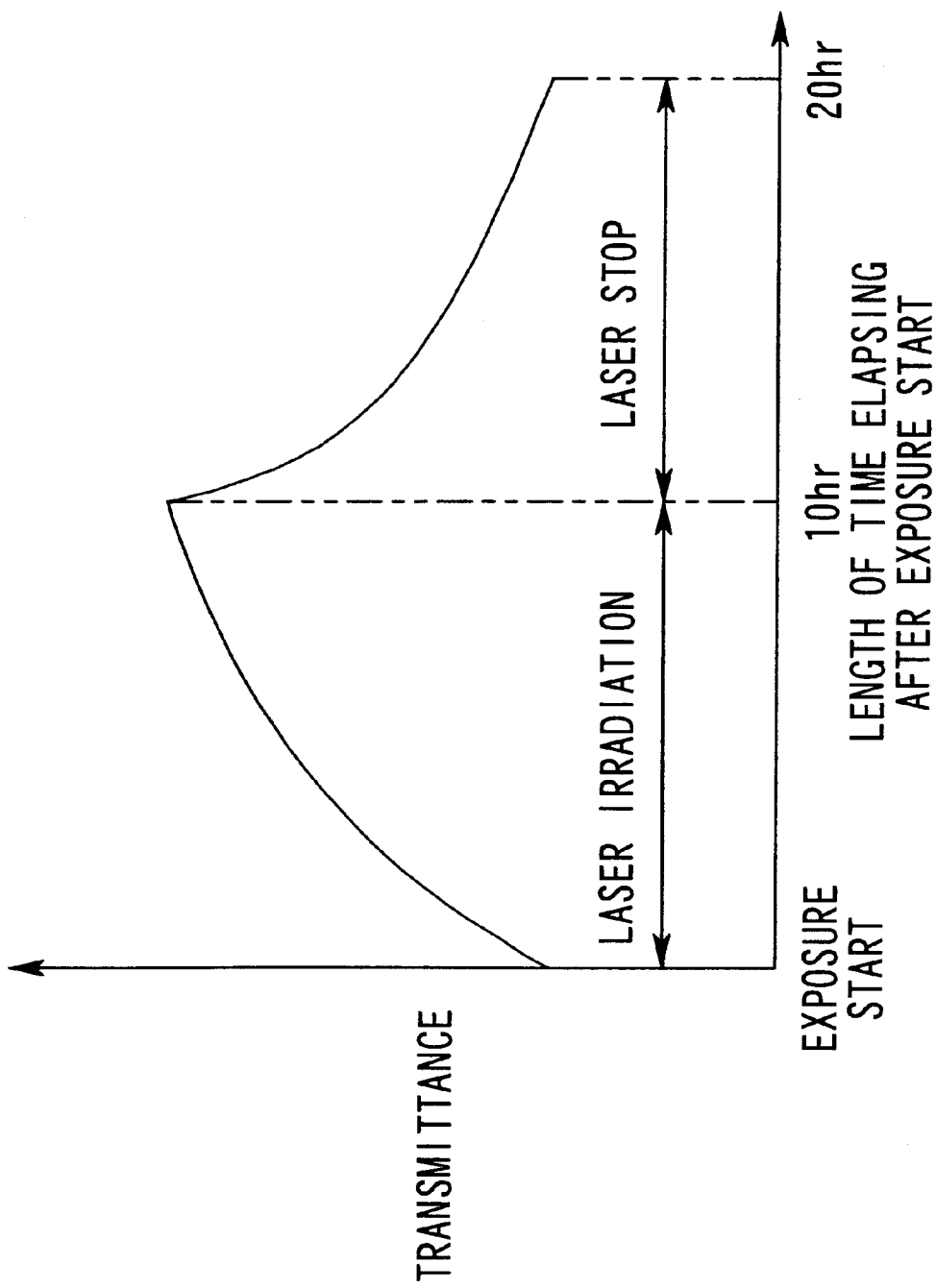
FIG. 17 is an explanatory view illustrating the transmittance that fluctuates in correspondence to varying lengths of the exposure period.

Next, an interruption in the exposure operation due to a reticule replacement is explained in reference to FIG. 16. FIG. 16 shows the characteristics diagram in FIG. 12 that illustrates the time-varying transmittance characteristics at a white reticule and at a black reticule. FIG. 16 is an explanatory view in case that an exposure operation on a white reticule is interrupted and an operation to replace the white reticule with a black reticule starts at the time point t1, at the time point t2, the delivery of the black reticule is completed and an exposure operation starts, at the time point t3, the exposure operation on the black reticule is interrupted and an operation for replacing the black reticule with the white reticule starts, and at the time point t4, the delivery of the white reticule ends and an exposure operation starts.

As the laser light irradiation is interrupted at the time point t1, the self-cleaning of the projection optical system 23 and the illumination optical system is interrupted as well. As a result, suspended contaminants within the projection optical system 23 and the illumination optical system become re-adhered to the surfaces of the optical elements in the optical systems or the transmittances (of the optical materials) of the optical elements themselves fluctuate to result in a reduction in the transmittances of the projection optical system 23 and the illumination optical system. When the laser light irradiation is resumed at the time point t2, self-cleaning of the optical elements starts again to result in an increase in the transmittances.

Thus, as explained earlier, at the time point t2 at which the laser light irradiation is resumed, the illuminance sensor 28 is moved onto the optical axis of the projection optical system 23 to measure the illuminance of the exposing light at the wafer stage 27 and, at the same time, the illuminance of the exposing light at the illumination optical system is detected by the integrator sensor 10. The transmittance at the time point t2 is calculated based upon the results of the measurement at the two sensors, and a time point t0 that corresponds to the calculated transmittance is determined based upon the time-varying transmittance characteristics of the black reticule represented by the dotted line. Then, when the exposure is resumed, the timer 58 that measures the length of exposure time elapsing after the exposure start is reset at the time point t0. Consequently, when the exposure operation starts, the storage device 57 references the table storing the time-varying transmittance characteristics of the black reticule in FIG. 16 to calculate the gain β by reading out the data corresponding to the length of time counted on the timer 58.

When the operation to replace the black reticule with the white reticule starts at the time point t3 and exposure using the white reticule starts at the time point t4, the transmittance at the time point t4 is calculated in a similar manner. Then, the table storing the time-varying transmittance characteristics at the white reticule is referenced to ascertain a time point t0' that corresponds to the transmittance and the timer 58 that measures the length of exposure time elapsing after the exposure start is reset at the time point t0'. Consequently, when the exposure operation starts, the storage device 57 references the table storing the time-varying transmittance characteristics of the white reticule in FIG. 16 to calculate the gain β by reading out the data corresponding to the length of time counted on the timer 58.

In FIGS. 15 and 16, the transmittance at the optical system at the point in time at which exposure that has been temporarily interrupted is resumed is ascertained, a time point corresponding to this transmittance is identified based upon the time-varying transmittance characteristics and the time point at which the exposure is to be resumed is corrected to control the illuminance of light exposing the wafer at a target value at the time of exposure restart. However, idle emission of laser pulses may be implemented at the time of the exposure restart until the transmittance on a characteristics curve representing the time-varying transmittance characteristics that is stored in advance is achieved. In such a case, it is necessary to provide a means for light blocking to ensure that laser pulses do not enter the wafer. For instance, a shutter that opens/closes the optical path between the projection optical system 23 and the wafer 25 may be provided. The shutter may be any of various types of shutters including mechanical shutters and electrical shutters constituted by using liquid crystal.

In addition, in this embodiment, the transmittance is detected by the integrator sensor 10 and the illuminance sensor 28 every time a wafer is replaced. However, it has been learned that the reduction in the transmittance occurring during the replacement is attributable to the reduced transmittances at the optical elements (optical materials) themselves to a greater degree than to the re-adhesion of suspended contaminants. Consequently, instead of measuring the transmittance as described above during a wafer replacement, the time-varying characteristics may be simply measured and stored in advance, so that the transmittance can be predicted (calculated) based upon the stored time-varying transmittance characteristics during a wafer replacement to adjust the intensity of the exposing light emitted by the light source 1.

In this case, since the reduction in the transmittances at the illumination optical system and the projection optical system are mainly attributable to reductions in the transmittances of the optical materials themselves, the transmittances at the two optical systems can be ascertained with a high degree of accuracy through prediction (calculation) described above alone, and an improvement in throughput can be achieved without compromising the control accuracy on the exposure dose at the wafer. However, if the control is to be implemented through the prediction alone, the control error may become large as time elapses.

In this type of projection exposure apparatus, twenty five wafers, for instance, are processed in a batch as one lot. Thus, every time the exposure of wafers in a lot ends or every time the reticule is replaced, the transmittance is detected by the integrator sensor 10 and the illuminance sensor 28. Then, the gain β is calculated by using these measured values as initial values and also by referencing the table of the time-varying characteristics to adjust the intensity of the exposing light emitted by the light source 1. In this case, the reduction in throughput can be minimized without lowering the control accuracy on the exposure dose.

An example in which reticules are classified according to the ratio of the pattern area against the reticule surface area is explained above. However, reticules may be classified from another viewpoint, i.e., various reticules including a phase-shift reticule and a halftone phase reticule, that are employed to improve the resolution of the transfer have different transmittances, and in correspondence, the different time-varying transmittance characteristics at the projection optical system as well. In this case, the illumination method, too, should be modified in correspondence to the reticule that is being used.

The intensity of the exposing light emitted by the light source 1 is adjusted by either predicting or measuring time-varying transmittance at the optical system ranging from the integrator sensor 10 to the wafer stage 26 to control the accumulated light quantity (exposure dose) of the plurality of pulse beams irradiated onto each point on the wafer at a correct value in the first and second embodiments explained above. However, in a scanning projection exposure apparatus (e.g., the scanning stepper disclosed in the U.S. Pat. No. 5,473,410) that uses a pulse beam, for instance, as exposing light, the number of pulse beams to be irradiated on a given point on the wafer through scanning exposure can be adjusted in correspondence to the transmittance predicted as described above or in correspondence to the intensity of the exposing light on the wafer ascertained based upon the transmittance. In other words, the exposure dose may be controlled at a correct value by adjusting at least one of: the width of the exposing light on the wafer along the scanning direction, the oscillation frequency at the light source 1 and the scanning speed at the wafer. In short, the exposure dose (exposure quantity) imparted to the wafer in the scanning exposure operation should be controlled at a correct value by adjusting at least one of: the intensity of the exposing light on the wafer, the width of the exposing light, the oscillation frequency and the scanning speed. At this time, the intensity of the exposing light on the wafer may be adjusted through adjustment of the light emission intensity at the light source 1 achieved by varying the voltage applied to the light source 1, through ND filter switching achieved by rotating the turret plate TP in FIG. 1 or through the combination of the adjustment of the light emission intensity and the ND filter switching.

In the case of a scanning type projection exposure apparatus (scanning stepper) that uses continuous light as exposing light, the exposure dose may be controlled at a correct value by adjusting at least one of the light emission intensity at the light source, the transmittance (extinction rate) at the light quantity adjuster such as the turret plate TP in FIG. 1 or the like, the width of the exposing light on the wafer and the scanning speed of the wafer in correspondence to the predicted transmittance value or the intensity of the exposing light at the wafer. In addition, in a projection exposure apparatus (stepper) that uses pulse beams as exposing light and exposes a wafer using the image of a pattern at a reticule while allowing the reticule and the wafer to remain stationary, at least, either the intensity of the exposing light at the wafer (the light emission intensity at the pulsed light source) or the number of exposing pulse beams needs to be adjusted. In a stepper that uses continuous light for exposing light, at least, either the intensity of the exposing light on the wafer (the light emission intensity at the light source or the like) or the length of irradiation time needs to be adjusted.

If fluctuations of the transmittances at the illumination optical system and the projection optical system during exposure cannot be disregarded, the adjustment described earlier (e.g., adjustment of the intensity of the exposing light on the wafer, or (adjustment of the number of pulses) etc., may be implemented during the exposure. In particular, in a scanning stepper using pulse beams, the number of exposing pulses may be determined by taking into further consideration the quantity of change (or the change rate) of the transmittance occurring during scanning exposure.

The projection optical system 23 in the embodiments explained above (see FIG. 1) is constituted of only refractive optical elements such as lenses. However, the projection optical system may be a so-called catadioptic optical system achieved by combining reflective optical elements such as mirrors and refractive optical elements, or it may be constituted of reflective optical elements only.

In addition, while the explanation is given above on an example in which the exposing light is ArF laser, the present invention may be adopted in a projection exposure apparatus that uses EUVL such as soft x-rays with an even smaller wavelength. Furthermore, while a predictive line of time-varying changes in the transmittance is calculated by measuring the transmittance of the exposing light at the optical system at a plurality of time points, another light source that emits light having a wavelength almost equal to the wavelength of the exposure light may be used instead. Moreover, if there is no fluctuation or very little fluctuation in the transmittance at the projection optical system, the time-varying transmittance characteristics need to be ascertained only for the illumination optical system. In this case, the transmittance should be measured based upon the output values from the integrator sensor 10 and the illuminance sensor which is placed on the reticule stage. If, on the other hand, there is no fluctuation or very little fluctuation in the transmittance at the illumination optical system, time-varying transmittance characteristics need only be ascertained for the projection optical system. In this case, the illuminance should be measured by extracting the exposing light in the area between the illumination optical system and the projection optical system. The exposing light itself may be used or another, separate light source that emits light having a wavelength almost equal to the wavelength of the exposing light may be employed, to determine the time-varying characteristics of transmittance at either the projection optical system or the illumination optical system.

It is to be noted that an exposure apparatus that predicts time-varying transmittance characteristics to implement exposure control based upon the predicted characteristics or an exposure apparatus that implements exposure control based upon pre-stored time-varying transmittance characteristics is assembled by electrically, mechanically or chemically linking a great number of components explained in reference to the embodiments.

In more specific terms, the exposure apparatus in the embodiments can be fabricated by performing optical adjustment with the illumination optical system and the projection optical system each constituted of a plurality of lenses mounted at the main unit of the exposure apparatus, connecting wirings and pipings with the reticule stage and wafer stage constituted of a great number of mechanical parts at the main unit of the exposure apparatus and performing overall adjustment (electrical adjustment, operational verification and the like). It is to be noted that it is desirable to fabricate the exposure apparatus in a clean room in which the temperature and the degree of contamination are closely controlled.

The exposure apparatus does not need to be employed only for semiconductor production, and the present invention may be adopted in a wide range of applications including an exposure apparatus for liquid crystal device that exposes a liquid crystal display element pattern onto a rectangular glass plate and an exposure apparatus employed to manufacture a thin film magnetic head. In addition, the magnifying power of the projection optical system may be the enlargement type, the reduction type or the neutral type.

Furthermore, the semiconductor device is fabricated through a step in which functions and performance of the device are designed, a step in which a reticule corresponding to the design is prepared, a step in which a wafer is produced from silicon material, a step in which a reticule pattern is exposed on the wafer by employing the exposure apparatus in the embodiments explained earlier, a step in which the device is assembled (includes dicing, bonding and packaging), an inspection step and the like.

What is claimed is:

1. An exposure method for projecting an image of a pattern illuminated by an exposure light emitted from an exposure light source onto a photosensitive substrate via an optical system, a transmittance of said optical system relative to the exposure light being changed over time, comprising:

measuring the transmittance of said optical system relative to a light having a wavelength substantially equal to a wavelength of the exposure light at a plurality of time points;

predicting time-varying transmittance characteristics of said optical system based upon the transmittances measured; and projecting the image of the pattern onto the photosensitive substrate based upon a result of the prediction.

2. An exposure method according to claim 1, wherein:

said plurality of time points at which the transmittance is measured include a time point before the light having substantially the same wavelength as that of the exposure light is irradiated on said optical system and a time point after the light having substantially the same wavelength as that of the exposure light is irradiated on said optical system over a length of time, and the two time points occur before the image of the pattern is projected onto the photosensitive substrate.

3. An exposure method according to claim 1, wherein:

said plurality of time points include a time point before the image of the pattern illuminated by the exposure light is projected onto the photosensitive substrate and a time point after the image of the pattern illuminated by the exposure light is projected onto the photosensitive substrate.

4. An exposure method according to claim 1, wherein:

an accumulated light quantity of the exposure light irradiated onto the photosensitive substrate is adjusted to a correct value that corresponds to a sensitivity of the photosensitive substrate based upon said predicted time-varying transmittance characteristics.

5. An exposure method according to claim 1, wherein:

intensity of the exposure light irradiated onto the photosensitive substrate is adjusted based upon predicted time-varying transmittance characteristics.

6. An exposure method according to claim 1, wherein:

when the photosensitive substrate is made to move relative to the exposure light from a mask to pass through said projection optical system in synchronization with movement of the mask relative to the exposure light during a process of irradiating a pulse beam exposure light emitted from said exposure light source and projecting the pattern formed on the mask onto the photosensitive substrate, an accumulated light quantity of the exposure light is controlled at a correct value corresponding to the sensitivity of the photosensitive substrate by adjusting at least one of: an intensity of the exposure light at the photosensitive substrate, a width of the exposure light on the photosensitive substrate relative to the moving direction in which the photosensitive substrate moves, a moving speed of the photosensitive substrate relative to a moving direction and an oscillation frequency of said exposure light source, based upon the time-varying transmittance characteristics.

7. An exposure method according to claim 1, wherein:

the light having a wavelength substantially equal to the wavelength of the exposure light is an exposure light emitted from said exposure light source.

8. An exposure method according to claim 7, wherein:

said plurality of time points include a time point before the image of the pattern illuminated by the exposure light is projected onto a single photosensitive substrate and a time point after the image of the pattern illuminated by the exposure light is projected onto the single photosensitive substrate.

9. An exposure method according to claim 7, wherein:

said optical system comprises an illumination optical system that illuminates the pattern with the exposure light and a projection optical system that projects the image of the pattern illuminated by said illumination optical system onto the photosensitive substrate;

the transmittance is measured a plurality of times in at least one of said illumination optical system and said projection optical system; and time-varying transmittance characteristics are predicted in at least one of said illumination optical system and said projection optical system.

10. An exposure method according to claim 7, wherein;

time-varying transmittance characteristics are calculated using a plurality of transmittances, each calculated based upon a ratio of an illuminance of the exposure light emitted from said exposure light source and an illuminance of the exposure light on the photosensitive substrate.

11. An exposure method according to claim 7, wherein:

said plurality of time points include a time point before the image of the pattern illuminated by the exposure light is projected onto an area on the photosensitive substrate and a time point after the image of the pattern illuminated by the exposure light is projected onto said area.

12. An exposure method according to claim 11, wherein:

said area is an exposure area corresponding to one chip.

13. An exposure method according to claim 11, wherein:

said area is an exposure area corresponding to one shot.

14. An exposure method according to claim 1, wherein:

said optical system comprises an illumination optical system that illuminates the pattern with the exposure light; and when fluctuations of the transmittance of said illumination optical system contribute to fluctuations of the transmittance of said optical system, a transmittance of said illumination optical system relative to light having a wavelength substantially equal to the wavelength of the exposure light is measured at a plurality of time points to predict time-varying transmittance characteristics of said optical system.

15. An exposure method according to claim 14, wherein:

said optical system further comprises a projection optical system that projects the image of the pattern illuminated by said illumination optical system onto the photosensitive substrate; and when fluctuations of the transmittances of said illumination optical system and said projection optical system contribute to fluctuations of the transmittance of said optical system, the transmittances of said illumination optical system and said projection optical system relative to light having a wavelength substantially equal to the wavelength of the exposure light are measured at a plurality of time points to predict time-varying transmittance characteristics of said optical system.

16. An exposure method according to claim 1, wherein:

said optical system comprises a projection optical system that projects the image of the pattern onto the photosensitive substrate with the exposure light; and when fluctuations of the transmittance of said projection optical system contribute to fluctuations of the transmittance of said optical system, a transmittance of said projection optical system relative to light having a wavelength substantially equal to the wavelength of the exposure light is measured at a plurality of time points to predict time-varying transmittance characteristics of said optical system.

17. An exposure method according to claim 16, wherein:

said optical system further comprises an illumination optical system that illuminates the pattern with the exposure light; and when fluctuations of the transmittances of said illumination optical system and said projection optical system contribute to fluctuations of the transmittance of said optical system, the transmittances of said illumination optical system and said projection optical system relative to light having a wavelength substantially equal to the wavelength of the exposure light are measured at a plurality of time points to predict time-varying transmittance characteristics of said optical system.

18. An exposure apparatus that projects an image of a pattern illuminated by exposure light emitted from an exposure light source onto a photosensitive substrate via an optical system, a transmittance of said optical system relative to the exposure light being changed over time, comprising:

a measuring device disposed in a light path of the exposure light to measure the transmittance of said optical system relative to a light having a wavelength substantially equal to the wavelength of the exposure light at a plurality of time points; and a prediction device connected to said measuring device to predict time-varying transmittance characteristics of said optical system based upon a plurality of measured transmittances.

19. An exposure apparatus according to claim 18, wherein:

said plurality of time points at which the transmittance is measured include a time point before the light having substantially the same wavelength as that of the exposure light is irradiated on said optical system and a time point after the light having substantially the same wavelength as that of the exposure light is irradiated on said optical system over a length of time, and the two time points occur before the image of the pattern is projected onto the photosensitive substrate.

20. An exposure apparatus according to claim 18, further comprising:

an accumulated exposure quantity controller connected to said prediction device to control an accumulated light quantity of the exposure light irradiated onto the photosensitive substrate at a correct value corresponding to a sensitivity of the photosensitive substrate, based upon the predicted time-varying transmittance characteristics.

21. An exposure apparatus according to claim 18, further comprising:

an exposure light intensity adjuster connected to said prediction device to adjust an intensity of the exposure light irradiated onto the photosensitive substrate based upon the predicted time-varying transmittance characteristics.

22. An exposure apparatus according to claim 18, wherein:

when the photosensitive substrate is made to move relative to the exposure light from a mask to pass through said projection optical system in synchronization with a movement of the mask relative to the exposure light during a process of irradiating a pulse beam exposure light emitted from said exposure light source and projecting a pattern formed on the mask onto the photosensitive substrate, said exposure apparatus comprises a control device that controls the accumulated light quantity of the exposure light at a correct value corresponding to a sensitivity of the photosensitive substrate by adjusting at least one of:

an intensity of the exposure light at the photosensitive substrate, a width of the exposure light on the photosensitive substrate relative to a moving direction in which the photosensitive substrate moves, a moving speed of the photosensitive substrate relative to the moving direction and an oscillation frequency of said exposure light source, based upon the time-varying transmittance characteristics.

23. An exposure apparatus according to claim 18, wherein:

the light having a wavelength substantially equal to the wavelength of the exposure light is exposure light emitted from said exposure light source.

24. An exposure apparatus according to claim 23, wherein:

said plurality of time points include a time point before the image of the pattern illuminated by the exposure light is projected onto the photosensitive substrate and a time point after the image of the pattern illuminated by the exposure light is projected onto the photosensitive substrate.

25. An exposure apparatus according to claim 23, wherein:

said plurality of time points include a time point before the image of the pattern illuminated by the exposure light is projected onto a single photosensitive substrate and a time point after the image of the pattern illuminated by the exposure light is projected onto the single photosensitive substrate.

26. An exposure apparatus according to claim 23, wherein:

said optical system comprises an illumination optical system disposed in the light path of the exposure light to illuminate the pattern with the exposure light and a projection optical system disposed in the light path of the exposure light to project the image of the pattern illuminated by said illumination optical system onto the photosensitive substrate;

said measuring device performs measurement of the transmittance a plurality of times in at least one of said illumination optical system and said projection optical system; and said prediction device predicts time-varying transmittance characteristics of at least one of said illumination optical system and said projection optical system.

27. An exposure apparatus according to claim 23, wherein:

said prediction device calculates time-varying transmittance characteristics based upon a plurality of transmittances, each calculated in correspondence to a ratio of an illuminance of the exposure light emitted from said exposure light source and an illuminance of the exposure light on the photosensitive substrate.

28. An exposure apparatus according to claim 23, wherein:

said plurality of time points include a time point before the image of a pattern illuminated by the exposure light is projected onto an area on the photosensitive substrate and a time point after the image of the pattern illuminated by the exposure light is projected onto said area.

29. An exposure apparatus according to claim 28, wherein:

said area is an exposure area corresponding to one chip.

30. An exposure apparatus according to claim 28, wherein:

said area is an exposure area corresponding to one shot.

31. An exposure apparatus according to claim 23, wherein:

said optical system comprises an illumination optical system disposed in the light path of the exposure light to illuminate the pattern with the exposure light; and when fluctuations of the transmittance of said illumination optical system contribute to fluctuations of the transmittance of said optical system, said measuring device measures the transmittance of said illumination optical system relative to the light having a wavelength substantially equal to the wavelength of the exposure light at a plurality of time points and said prediction device predicts time-varying transmittance characteristics of said optical system based upon a result of the measurement performed a plurality of times.

32. An exposure apparatus according to claim 31, wherein:

said optical system further comprises a projection optical system disposed in the light path of the exposure light to project the image of the pattern illuminated by said illumination optical system onto the photosensitive substrate; and when fluctuations of the transmittances of said illumination optical system and said projection optical system contribute to fluctuations of the transmittance of said optical system, said measuring device measures the transmittances of said illumination optical system and said projection optical system relative to the light having a wavelength substantially equal to the wavelength of the exposure light at a plurality of time points and said prediction device predicts time-varying transmittance characteristics of said optical system based upon the results of the measurement performed a plurality of times.

33. An exposure apparatus according to claim 18, wherein:

said optical system comprises a projection optical system disposed in the light path of the exposure light to project the image of the pattern onto the photosensitive substrate with the exposure light; and when fluctuations of the transmittance of said projection optical system contribute to fluctuations of the transmittance of said optical system, said measuring device measures the transmittance of said projection optical system relative to the light having a wavelength substantially equal to the wavelength of the exposure light at a plurality of time points and said prediction device predicts time-varying transmittance characteristics of said optical system.

34. An exposure apparatus according to claim 33, wherein:

said optical system further comprises an illumination optical system disposed in the light path of the exposure light to illuminate the pattern with the exposure light; and when fluctuations of the transmittances of said illumination optical system and said projection optical system contribute to fluctuations of the transmittance of said optical system, said measuring device measures the transmittances of said illumination optical system and said projection optical system relative to the light having a wavelength substantially equal to the wavelength of the exposure light at a plurality of time points and said prediction device predicts time-varying transmittance characteristics of said optical system based upon results of measurements performed a plurality of times.

35. A method of fabricating a semiconductor device by using a projection exposure apparatus having an optical system that projects an image of a pattern illuminated by an exposure light emitted from an exposure light source onto a photosensitive substrate via said optical system, the transmittance of said optical system relative to the exposure light being changed over time, comprising:

measuring the transmittance of said optical system relative to light having a wavelength that is substantially equal to the wavelength of the exposure light at a plurality of time points;

predicting time-varying transmittance characteristics of said optical system based upon the plurality of measured transmittances; and projecting the image of the pattern onto the photosensitive substrate based upon a result of the prediction.

36. An optical cleaning method for optically cleaning an optical system in a projection exposure apparatus that projects an image of a pattern illuminated by an exposure light emitted from an exposure light source onto a photosensitive substrate via said optical system, the transmittance of said optical system relative to the exposure light being changed over time, comprising:

measuring the transmittance of said optical system relative to a light having a wavelength substantially equal to the wavelength of the exposure light at a plurality of time points; and optically cleaning said optical system while predicting the time-varying transmittance characteristics of said optical system based upon the plurality of measured transmittances.

37. An optical cleaning method according to claim 36, wherein:

said plurality of time points at which the transmittance is measured include a time point before the light having substantially the same wavelength as that of the exposure light is irradiated on said optical system and a time point after the light having substantially the same wavelength as that of the exposure light is irradiated on said optical system over a length of time, and the two time points occur before the image of the pattern is projected onto the photosensitive substrate.

38. An exposure apparatus comprising:

an illumination optical system disposed in a light path of an exposure light to illuminate a mask on which a pattern is formed with exposure light emitted from an exposure light source;

a projection optical system disposed in the light path of the exposure light to project the image of the pattern on the mask illuminated by said illumination optical system onto a photosensitive substrate via said projection optical system, the transmittance of said optical system relative to the exposure light being changed over time;

a mask illuminance detector disposed between the exposure light source and the mask to detect the illuminance of the exposure light irradiated on the mask from the exposure light source;

a substrate illuminance detector provided on a surface substantially the same as the surface of said photosensitive substrate to detect the illuminance of the exposure light on the photosensitive substrate;

a prediction device connected to said mask illuminance detector and said substrate illuminance detector to predict time-varying transmittance characteristics of said projection optical system relative to the exposure light by calculating the ratio of the illuminance of the exposure light irradiated on the mask detected by said mask illuminance detector and the illuminance of the exposure light irradiated on the substrate detected by said substrate illuminance detector a plurality of times; and a control device connected to said prediction device to adjust an accumulated light quantity of the exposure light at the photosensitive substrate based upon the predicted time-varying characteristics and a ratio of the two illuminances.

39. An exposure apparatus according to claim 38, wherein:

when the transmittance of said illumination optical system relative to the exposure light also changes over time, said prediction device predicts time-varying transmittance characteristics of the entire optical system comprising said illumination optical system and said projection optical system relative to the exposure light.

40. An exposure apparatus comprising:

an illumination optical system disposed in a light path of an exposure light to illuminate a mask on which a pattern is formed with exposure light emitted from an exposure pulsed light source;

a projection optical system disposed in the light path of the exposure light to project the image of the pattern on the mask illuminated by said illumination optical system onto a photosensitive substrate, a transmittance of at least one of said illumination optical system and said projection optical system relative to the exposure light being changed over time;

a mask illuminance detector disposed between said exposure pulsed light source and the mask to detect the illuminance of the exposure light irradiated on the mask from said exposure pulsed light source;

a substrate illuminance detector provided on a surface substantially the same as a surface of the photosensitive substrate to detect the illuminance of the exposure light on the photosensitive substrate;

a prediction device connected to said mask illuminance detector and said substrate illuminance detector to predict time-varying transmittance characteristics of said projection optical system relative to the exposure light by calculating the ratio of the illuminance of the exposure light irradiated on the mask detected by said mask illuminance detector and the illuminance of the exposure light irradiated on the substrate detected by said substrate illuminance detector a plurality of times; and a control device connected to said prediction device to adjust at least one of the intensity of pulsed exposure light irradiated onto the photosensitive substrate and the number of pulses to control an accumulated light quantity of the exposure light irradiated onto the photosensitive substrate at a correct value corresponding to the sensitivity of the photosensitive substrate, based upon predicted time-varying characteristics and a ratio of the two illuminances.

41. An exposure method implemented in a projection exposure apparatus having an illumination optical system that illuminates a mask having a pattern formed therein with exposure light emitted from an exposure pulsed light source and a projection optical system that projects an image of the pattern on the mask illuminated by said illumination optical system onto a photosensitive substrate, a transmittance of at least one of said illumination optical system and said projection optical system relative to the exposure light being changed over time, said method comprising:

predicting a time-varying transmittance characteristics of at least one of said illumination optical system and said projection optical system relative to the exposure light by calculating the ratio of illuminance of the exposure light emitted from said exposure pulsed light source and an illuminance of the exposure light on the photosensitive substrate a plurality of times; and adjusting at least one of the intensity of the pulsed exposure light at the photosensitive substrate and the number of pulses based upon the ratio of the illuminance of the exposure light emitted from said exposure pulsed light source and the illuminance of the exposure light on the photosensitive substrate and the predicted time-varying transmittance characteristics.

42. An exposure method implemented in a projection exposure apparatus having an illumination optical system that illuminates a mask having a pattern formed therein with an exposure light emitted from an exposure light source and a projection optical system that projects an image of the pattern on the mask illuminated by said illumination optical system onto a photosensitive substrate, a transmittance of at least one of said illumination optical system and said projection optical system relative to the exposure light being changed over time, said method comprising:

predicting a time-varying transmittance characteristics of at least one of said illumination optical system and said projection optical system relative to the exposure light by calculating a ratio of illuminance of the exposure light emitted from said exposure light source and an illuminance of the exposure light on the photosensitive substrate a plurality of times; and adjusting at least one of the intensity of the exposure light irradiated onto the photosensitive substrate based upon the ratio of the illuminance of the exposure light emitted from said exposure light source and an illuminance of the exposure light on the photosensitive substrate, and the predicted time-varying transmittance characteristics.

43. An exposure method implemented in a projection exposure apparatus having an illumination optical system that illuminates a mask having a pattern formed therein with an exposure light emitted from an exposure light source and a projection optical system that projects an image of the pattern on the mask illuminated by said illumination optical system onto a photosensitive substrate, the transmittance of said projection optical system relative to the exposure light being changed over time, said method comprising:

predicting time-varying transmittance characteristics of said projection optical system relative to the exposure light by calculating a ratio of illuminance of the exposure light emitted from said exposure light source and an illuminance of the exposure light on the photosensitive substrate a plurality of times; and adjusting the intensity of the exposure light irradiated onto the photosensitive substrate based upon the ratio of the illuminance of the exposure light emitted from said exposure light source and an illuminance of the exposure light on the photosensitive substrate and the predicted time-varying transmittance characteristics.

44. An exposure method implemented in a projection exposure apparatus having an illumination optical system that illuminates a mask having a pattern formed therein with an exposure light emitted from an exposure, light source and a projection optical system that projects an image of the pattern on the mask illuminated by said illumination optical system onto a photosensitive substrate, a transmittance of at least one of said illumination optical system and said projection optical system relative to the exposure light being changed over time, said method comprising:

adjusting the intensity of the exposure light irradiated onto the photosensitive substrate based upon a ratio of an illuminance of the exposure light emitted from said exposure light source and illuminance of the exposure light on the photosensitive substrate and time-varying transmittance characteristics of at least one of said illumination optical system and said projection optical system relative to the exposure light.

45. An exposure method implemented in a projection exposure apparatus having an illumination optical system that illuminates a mask having a pattern formed therein with an exposure light emitted from an exposure light source and a projection optical system that projects an image of the pattern on the mask illuminated by said illumination optical system onto a photosensitive substrate, the transmittance of said projection optical system relative to the exposure light being changed over time, said method comprising:

adjusting an accumulated quantity of the exposure light at the photosensitive substrate based upon a ratio of an illuminance of the exposure light emitted from said exposure light source and an illuminance of the exposure light on the photosensitive substrate and time-varying transmittance characteristics of said projection optical system relative to the exposure light.

46. An exposure method according to claim 45, wherein:
when the transmittance of said illumination optical system relative to the exposure light also changes over time, the intensity of the exposure light emitted from said exposure light source is adjusted based upon time-varying transmittance characteristics of the entire optical system comprising said illumination optical system and said projection optical system relative to the exposure light, and the ratio of the illuminances.

47. An exposure method according to claim 45, wherein:
the exposure light is a pulse beam and the accumulated quantity of the exposure light is controlled at a correct value corresponding to the sensitivity of the photosensitive substrate by adjusting at least one of the intensity of the exposure light at the photosensitive substrate and the number of the exposure light beams irradiated on a given point on the photosensitive substrate.

48. An exposure method according to claim 45, wherein:
the photosensitive substrate is controlled to move relative to the exposure light from the mask and passes through said projection optical system in synchronization with the movement of the mask relative to the exposure light, in order to transfer the pattern onto the photosensitive substrate.

49. An exposure method according to claim 48, wherein:
the exposure light is a pulse beam and the accumulated light quantity of the exposure light is controlled at a correct value corresponding to a sensitivity of the photosensitive substrate by adjusting at least one of: an intensity of the exposure light at the photosensitive substrate, a width of the exposure light on the photosensitive substrate relative to a moving direction in which the photosensitive substrate moves, a moving speed of the photosensitive substrate relative to the moving direction and an oscillation frequency of said exposure light source.

50. An exposure apparatus comprising:

an illumination optical system disposed in a light path of an exposure light to illuminate a mask on which a pattern is formed with exposure light emitted from an exposure pulsed light source, and a projection optical system disposed in the light path of the exposure light to project an image of the pattern on the mask illuminated by said illumination optical system onto a photosensitive substrate, a transmittance of at least one of said illumination optical system and said projection optical system relative to the exposure light being changed over time;

a mask illuminance detector that detects the illuminance of the exposure light irradiated on the mask from said exposure light source;

a substrate illuminance detector that detects the illuminance of the exposure light on the photosensitive substrate;

a storage device that stores in memory characteristics of time-varying transmittance of said projection optical system relative to the exposure light; and a control device that adjusts the accumulated light quantity of the exposure light at the photosensitive substrate based upon a ratio of illuminance of the exposure light irradiated on the mask detected by said mask illuminance detector and the illuminance of the exposure light irradiated onto the photosensitive substrate detected by said substrate illuminance detector and time-varying characteristics stored in said storage device.

51. An exposure apparatus according to claim 50, wherein:

when the transmittance of said illumination optical system relative to the exposure light also changes over time, time-varying transmittance characteristics of said entire optical system comprising said illumination optical system and said projection optical system relative to the exposure light are stored in said storage device.

52. An exposure apparatus according to claim 50, wherein:

a plurality of sets of time-varying characteristics of said entire optical system relative to the exposure light are set corresponding to varying exposure conditions and stored in said storage device.

53. An exposure apparatus according to claim 52, wherein:

when an exposure condition does not fit any of the exposure conditions stored in said storage device, an interpolation operation of time-varying characteristics stored in memory is performed to calculate the transmittance.

54. An exposure apparatus according to claim 52, wherein:

the exposure conditions are illuminating conditions of said illumination optical system.

55. An exposure apparatus according to claim 52, wherein:

the exposure conditions are types of the masks.

56. An exposure apparatus according to claim 52, wherein:

the exposure conditions are numerical apertures of said projection optical system.

57. An exposure method implemented in a projection exposure apparatus having an illumination optical system that illuminates a mask having a pattern formed therein with a pulsed exposure light emitted from an exposure light source and a projection optical system that projects an image of the pattern on the mask illuminated by said illumination optical system onto a photosensitive substrate, a transmittance of at least one of said illumination optical system and said projection optical system relative to the exposure light being changed over time, said method comprising:

detecting an intensity of the pulsed exposure light emitted from said exposure light source;

detecting the pulsed exposure light at the photosensitive substrate; and adjusting at least one of the intensity of the pulsed exposure light at the photosensitive substrate and a number of pulses based upon; a ratio of the illuminance of the exposure light emitted from said exposure light source, an illuminance of the exposure light on the photosensitive substrate and at least one predicted time-varying transmittance characteristic.

58. An exposure apparatus comprising:

an illumination optical system that illuminates a mask on which a pattern is formed with exposure light emitted from an exposure pulsed light source, and a projection optical system that projects an image of the pattern on the mask illuminated by said illumination optical system onto a photosensitive substrate, a transmittance of at least one of said illumination optical system and said projection optical system relative to the exposure light being changed over time;

a mask illuminance detector that detects the illuminance of the exposure light irradiated on the mask from said exposure pulsed light source;

a substrate illuminance detector that detects the illuminance of the exposure light on the photosensitive substrate;

a storage device that stores in memory characteristics of time-varying transmittance of said projection optical system relative to the exposure light; and a control device that adjusts at least one of the intensity of the pulsed exposure light irradiated onto the photosensitive substrate and the number of pulses, to control the accumulated light quantity of the exposure light irradiated onto the photosensitive substrate at a correct value corresponding to the sensitivity of the photosensitive substrate based upon a ratio of illuminance of the exposure light irradiated on the mask detected by said mask illuminance detector, the illuminance of the exposure light irradiated on the photosensitive substrate detected by said substrate illuminance detector, and time-varying transmittance characteristics stored in said storage device.

59. An exposure apparatus having an optical system that projects an image of a pattern illuminated by an exposure light emitted from an exposure light source onto a photosensitive substrate, a transmitance of said optical system relative to the exposure light being changed over time, comprising:

a measuring device that is provided at a position at which the transmittance of said optical system can be measured and measure's the transmittance of said optical system relative to a light having a wavelength substantially equal to the wavelength of the exposure light at a plurality of time points; and a prediction device that is connected to said measuring device and predicts time-varying transmittance characteristics of said optical system based upon a plurality of measured transmittances.

60. An exposure apparatus according to claim 59, wherein:

said optical system comprises an illumination optical system disposed in a light path of the exposure light to illuminate the pattern with the exposure light and a projection optical system disposed on the light path of the exposure light to project the image of the pattern illuminated by said illumination optical system onto the photosensitive substrate; and said measuring device comprises a pattern illuminance detector that detects an illuminance of the exposure light irradiated on the pattern from said exposure light source and a substrate illuminance detector that detects an illuminance of the exposure light on the photosensitive substrate.

61. A method of assembling a projection exposure apparatus having an optical system disposed on a light path of an exposure light to project an image of a pattern illuminated by exposure light emitted from an exposure light source onto a photosensitive substrate, the transmittance of said optical system relative to the exposure light being changed over time, wherein:

a measuring device that measures the transmittance of said optical system relative to light having a wavelength substantially equal to the wavelength of the exposure light at a plurality of time points is provided at a position at which the transmittance of said optical system can be measured; and a prediction device that predicts time-varying transmittance characteristics of said optical system based upon a plurality of measured transmittances is connected to said measuring device.

* * * * *